US009924385B2

(12) United States Patent
Lysejko et al.

(10) Patent No.: US 9,924,385 B2
(45) Date of Patent: Mar. 20, 2018

(54) ANTENNA APPARATUS AND METHOD OF CONFIGURING A TRANSMISSION BEAM FOR THE ANTENNA APPARATUS

(71) Applicant: Airspan Networks Inc., Boca Raton, FL (US)

(72) Inventors: Martin Lysejko, Bagshot (GB); Krzysztof Dudzinski, Langley (GB); Michele Frances Bozier, Amersham (GB)

(73) Assignee: AIRSPAN NETWORKS INC., Boca Raton, FL (US)

( * ) Notice: Subject to any disclaimer, the term of this patent is extended or adjusted under 35 U.S.C. 154(b) by 0 days.

(21) Appl. No.: 15/182,209

(22) Filed: Jun. 14, 2016

(65) Prior Publication Data

US 2016/0381570 A1    Dec. 29, 2016

(30) Foreign Application Priority Data

Jun. 25, 2015  (GB) .................................. 1511200.6
Oct. 30, 2015  (GB) .................................. 1519228.9

(51) Int. Cl.
*H04M 1/00*     (2006.01)
*H04W 24/02*    (2009.01)
(Continued)

(52) U.S. Cl.
CPC ............ *H04W 24/02* (2013.01); *F16M 11/06* (2013.01); *G01S 3/043* (2013.01); *G01S 3/14* (2013.01);
(Continued)

(58) Field of Classification Search
CPC ......... F16M 11/06; G01S 19/24; G01S 19/53; G01S 3/043; G01S 3/14; G01S 5/0247;
(Continued)

(56) References Cited

U.S. PATENT DOCUMENTS 4,599,620 A    7/1986  Evans
4,633,256 A   12/1986  Chadwick
(Continued)

FOREIGN PATENT DOCUMENTS

CN    1284794 A    2/2001
CN  104635203 A    5/2015
(Continued)

OTHER PUBLICATIONS

UK Search Report from GB 1514938.8, dated Apr. 18, 2016, 4 pgs.
(Continued)

*Primary Examiner* — Xin Jia
(74) *Attorney, Agent, or Firm* — Haynes Beffel & Wolfeld LLP

(57) ABSTRACT

An antenna apparatus operates as a base station in a wireless network, with a method configuring a transmission beam within such antenna apparatus. The antenna apparatus has a rotatable antenna assembly employing selected transmission beam patterns, and a controller to rotate the antenna assembly altering its azimuth direction. During configuration mode, a sweep operation rotates the antenna assembly to selected azimuth directions. Quality metric determination circuitry determines, for each selected azimuth direction, a link quality metric for wireless terminals based on communication between the wireless terminals and the base station whilst the rotatable antenna assembly is at that selected azimuth direction. Transmission beam determination circuitry determines, from the link quality metrics determined for the wireless terminals at each selected azimuth direction, both a transmission beam pattern and an azimuth direction for subsequent communication with the wireless terminals. The antenna apparatus efficiently self-configures its transmission beam pattern and azimuth direction.

17 Claims, 21 Drawing Sheets

(51) Int. Cl.

| | | |
|---|---|---|
| F16M 11/06 | (2006.01) | |
| G01S 3/04 | (2006.01) | |
| G01S 3/14 | (2006.01) | |
| G01S 5/02 | (2010.01) | |
| G01S 19/24 | (2010.01) | |
| G01S 19/53 | (2010.01) | |
| H01Q 1/02 | (2006.01) | |
| H01Q 1/12 | (2006.01) | |
| H01Q 1/24 | (2006.01) | |
| H01Q 1/36 | (2006.01) | |
| H01Q 1/42 | (2006.01) | |
| H01Q 1/50 | (2006.01) | |
| H01Q 3/02 | (2006.01) | |
| H01Q 3/04 | (2006.01) | |
| H01Q 3/10 | (2006.01) | |
| H01Q 3/12 | (2006.01) | |
| H01Q 3/24 | (2006.01) | |
| H01Q 3/36 | (2006.01) | |
| H01Q 21/00 | (2006.01) | |
| H01Q 21/06 | (2006.01) | |
| H01Q 21/08 | (2006.01) | |
| H01Q 21/20 | (2006.01) | |
| H01Q 21/24 | (2006.01) | |
| H01Q 21/28 | (2006.01) | |
| H01Q 25/00 | (2006.01) | |
| H04B 7/0456 | (2017.01) | |
| H04B 7/06 | (2006.01) | |
| H04L 12/24 | (2006.01) | |
| H04L 12/26 | (2006.01) | |
| H04L 29/08 | (2006.01) | |
| H04W 4/00 | (2018.01) | |
| H04W 16/28 | (2009.01) | |
| H04W 24/08 | (2009.01) | |
| H04W 24/10 | (2009.01) | |
| H04W 28/02 | (2009.01) | |
| H04W 28/24 | (2009.01) | |
| H04W 40/22 | (2009.01) | |
| H04W 48/06 | (2009.01) | |
| H04W 72/04 | (2009.01) | |
| H04W 72/08 | (2009.01) | |
| H04W 88/04 | (2009.01) | |
| H05K 7/20 | (2006.01) | |
| H01Q 3/26 | (2006.01) | |
| H04B 7/08 | (2006.01) | |
| H04W 84/02 | (2009.01) | |
| H04W 84/04 | (2009.01) | |
| H04W 88/08 | (2009.01) | |

(52) U.S. Cl.
CPC ............ *G01S 5/0247* (2013.01); *G01S 19/24* (2013.01); *G01S 19/53* (2013.01); *H01Q 1/02* (2013.01); *H01Q 1/1207* (2013.01); *H01Q 1/1228* (2013.01); *H01Q 1/246* (2013.01); *H01Q 1/36* (2013.01); *H01Q 1/42* (2013.01); *H01Q 1/50* (2013.01); *H01Q 3/02* (2013.01); *H01Q 3/04* (2013.01); *H01Q 3/10* (2013.01); *H01Q 3/12* (2013.01); *H01Q 3/24* (2013.01); *H01Q 3/36* (2013.01); *H01Q 21/00* (2013.01); *H01Q 21/065* (2013.01); *H01Q 21/08* (2013.01); *H01Q 21/205* (2013.01); *H01Q 21/24* (2013.01); *H01Q 21/28* (2013.01); *H01Q 25/002* (2013.01); *H01Q 25/005* (2013.01); *H04B 7/0456* (2013.01); *H04B 7/0617* (2013.01); *H04B 7/0621* (2013.01); *H04B 7/0691* (2013.01); *H04B 7/0695* (2013.01); *H04B 7/086* (2013.01); *H04B 7/088* (2013.01); *H04B 7/0874* (2013.01); *H04L 41/0806* (2013.01); *H04L 41/0816* (2013.01); *H04L 43/0829* (2013.01); *H04L 67/18* (2013.01); *H04L 67/34* (2013.01); *H04W 4/001* (2013.01); *H04W 16/28* (2013.01); *H04W 24/08* (2013.01); *H04W 24/10* (2013.01); *H04W 28/0236* (2013.01); *H04W 28/0268* (2013.01); *H04W 28/0284* (2013.01); *H04W 28/24* (2013.01); *H04W 40/22* (2013.01); *H04W 48/06* (2013.01); *H04W 72/042* (2013.01); *H04W 72/085* (2013.01); *H04W 88/04* (2013.01); *H05K 7/20* (2013.01); *H01Q 1/1257* (2013.01); *H01Q 3/26* (2013.01); *H01Q 3/2611* (2013.01); *H04B 7/0817* (2013.01); *H04W 84/02* (2013.01); *H04W 84/045* (2013.01); *H04W 88/08* (2013.01)

(58) Field of Classification Search
CPC ...... H01Q 1/02; H01Q 1/1207; H01Q 1/1228; H01Q 1/246; H01Q 1/36; H01Q 1/42; H01Q 1/50; H01Q 21/00
See application file for complete search history.

(56) References Cited

U.S. PATENT DOCUMENTS

| | | |
|---|---|---|
| 4,959,653 A | 9/1990 | Ganz |
| 6,124,832 A | 9/2000 | Jeon et al. |
| 6,404,385 B1 | 6/2002 | Croq et al. |
| 6,486,832 B1 | 11/2002 | Abramov et al. |
| 6,522,898 B1 | 2/2003 | Kohno et al. |
| 6,621,454 B1 | 9/2003 | Reudink et al. |
| 6,934,511 B1 | 8/2005 | Lovinggood et al. |
| 7,593,693 B1 | 9/2009 | Kasapi et al. |
| 8,577,416 B2 | 11/2013 | Nandagopalan et al. |
| 8,630,267 B1 | 1/2014 | Jin |
| 9,706,419 B2 | 7/2017 | Bozier et al. |
| 2002/0042274 A1 | 4/2002 | Ades |
| 2003/0195017 A1 | 10/2003 | Chen et al. |
| 2003/0228857 A1* | 12/2003 | Maeki ............... H01Q 1/246 455/278.1 |
| 2004/0106436 A1 | 6/2004 | Ochi et al. |
| 2004/0233103 A1 | 11/2004 | Toshev |
| 2004/0242274 A1 | 12/2004 | Corbett et al. |
| 2005/0048921 A1 | 3/2005 | Chung |
| 2005/0063340 A1 | 3/2005 | Hoffmann et al. |
| 2005/0157684 A1 | 7/2005 | Ylitalo et al. |
| 2005/0285784 A1 | 12/2005 | Chiang et al. |
| 2006/0292991 A1* | 12/2006 | Abramov ............ H01Q 3/04 455/63.4 |
| 2008/0005121 A1 | 1/2008 | Lam et al. |
| 2009/0005121 A1 | 1/2009 | Wong et al. |
| 2009/0207077 A1 | 8/2009 | Hwang et al. |
| 2010/0071049 A1 | 3/2010 | Bahr et al. |
| 2011/0235569 A1 | 9/2011 | Huang et al. |
| 2011/0244808 A1 | 10/2011 | Shiotsuki et al. |
| 2012/0119951 A1 | 5/2012 | Vollath |
| 2013/0203401 A1* | 8/2013 | Ryan ............... H04W 24/02 455/422.1 |
| 2013/0215844 A1* | 8/2013 | Seol ............... H04W 72/046 370/329 |
| 2014/0256376 A1 | 9/2014 | Weissman et al. |
| 2014/0313080 A1 | 10/2014 | Smith et al. |
| 2015/0078191 A1 | 3/2015 | Jongren et al. |
| 2016/0277087 A1* | 9/2016 | Jo ............... H04B 7/0617 |
| 2016/0377695 A1 | 12/2016 | Lysejko et al. |
| 2016/0380353 A1 | 12/2016 | Lysejko et al. |
| 2016/0380354 A1 | 12/2016 | Bozier et al. |
| 2016/0380355 A1 | 12/2016 | Lysejko et al. |
| 2016/0380363 A1 | 12/2016 | Logothetis |
| 2016/0381574 A1 | 12/2016 | Dudzinski et al. |

(56) References Cited

U.S. PATENT DOCUMENTS

| | | |
|---|---|---|
| 2016/0381585 A1 | 12/2016 | Dudzinski et al. |
| 2016/0381590 A1 | 12/2016 | Lysejko et al. |
| 2016/0381591 A1 | 12/2016 | Lysejko et al. |

FOREIGN PATENT DOCUMENTS

| | | |
|---|---|---|
| EP | 0654915 A2 | 5/1995 |
| EP | 1903348 A1 | 3/2008 |
| EP | 2113145 A1 | 11/2009 |
| EP | 2207267 A2 | 7/2010 |
| EP | 2391157 A2 | 11/2011 |
| EP | 2448144 A1 | 5/2012 |
| EP | 2506625 A1 | 10/2012 |
| EP | 2538712 A1 | 12/2012 |
| GB | 2318914 A | 5/1998 |
| GB | 2484377 A | 4/2012 |
| JP | H05188128 A | 7/1993 |
| JP | H06188802 A | 7/1994 |
| KR | 101346062 B1 | 12/2013 |
| WO | 9426001 A1 | 11/1994 |
| WO | 199965105 A1 | 12/1999 |
| WO | 0152447 A2 | 7/2001 |
| WO | 0231908 A2 | 4/2002 |
| WO | 03096560 A1 | 11/2003 |
| WO | 2004095764 A2 | 11/2004 |
| WO | 2004114546 A1 | 12/2004 |
| WO | 2005064967 A1 | 7/2005 |
| WO | 2007010274 A1 | 1/2007 |
| WO | 2007069809 A1 | 6/2007 |
| WO | 2008/064696 A1 | 6/2008 |
| WO | 2008111882 A1 | 9/2008 |
| WO | 2008151057 A2 | 12/2008 |
| WO | 2010077790 A1 | 7/2010 |
| WO | 2011044947 A1 | 4/2011 |
| WO | 2011060058 A1 | 5/2011 |
| WO | 2014106539 A1 | 7/2014 |

OTHER PUBLICATIONS

UK Search Report from GB 1516901.4, dated Mar. 18, 2016, 5 pgs.
UK Search Report from GB 1518654.7, dated Mar. 24, 2016, 3 pgs.
UK Search Report from GB 1519216.4, dated Apr. 15, 2016, 5 pgs.
UK Search Report from GB 1519220.6, dated Apr. 4, 2016, 4 pgs.
UK Search Report from GB 1519228.9, dated Apr. 29, 2016, 4 pgs.
UK Search Report from GB 1519270.1, dated Apr. 25, 2016, 5 pgs.
UK Search Report from GB 1519272.7, dated Jun. 10, 2016, 3 pgs.
UK Search Report from GB 1519273.5, dated Apr. 27, 2016, 3 pgs.
PCT Search Report from PCT/GB2016/051285, dated Jul. 13, 2016, 12 pgs.
UK Search Report from GB 1519237.0, dated Jun. 10-Apr. 2016, 3 pgs.
PCT Search Report from PCT/GB2016/051195, dated Jul. 25, 2016, 13 pgs.
PCT Search Report from PCT/GB2016/051205, dated Jul. 25, 2016, 13 pgs.
Doi et al., "Low-Cost Antenna Array Via Antenna Switching for High Resolution 2-D DOA Estimation," SIPS 2013 Proc. IEEE, Oct. 16, 2013, pp. 83-88.
PCT Search Report from PCT/GB2016/051615 (corresponding to U.S. Appl. No. 15/187,515), dated Aug. 12, 2016, 13 pgs.
PCT Search Report from PCT/GB2016/051618 (corresponding to U.S. Appl. No. 15/187,602), dated Aug. 12, 2016, 12 pgs.
Office Action in related Case U.S. Appl. No. 15/186,134 dated Nov. 22, 2016, 18 pages.
PCT Search Report from PCT/GB2016/051428 (corresponding to U.S. Appl. No. 15/187,188), dated Dec. 13, 2016, 19 pgs.
Jung et al., "Attitude Sensing Using a GPS Antenna on a Turntable: Experimental Tests," Navigation, J. of the Institute of Navigation, Fairfax, VA, US, vol. 51, No. 3, Dec. 1, 2004, pp. 221-230.
PCT Search Report from PCT/GB2016/051234 (corresponding to U.S. Appl. No. 15/187,570), dated Aug. 5, 2016, 13 pgs.
PCT Search Report from PCT/GB2016/051360 (corresponding to U.S. Appl. No. 15/187,900), dated Aug. 19, 2016, 12 pgs.
PCT Search Report from PCT/GB2016/051617 (corresponding to U.S. Appl. No. 15/187,616), dated Aug. 23, 2016, 11 pgs.
PCT Search Report from PCT/GB2016/051759 (corresponding to U.S. Appl. No. 15/187,680), dated Sep. 14, 2016, 15 pgs.
PCT Written Opinion from PCT/GB2016/051195, dated May 17, 2017, 5 pgs.
PCT Written Opinion from PCT/GB2016/051205, dated May 16, 2017, 5 pgs.
PCT Written Opinion from PCT/GB2016/051234, dated May 17, 2017, 10 pgs.
PCT Written Opinion from PCT/GB2016/051285, dated May 10, 2017, 5 pgs.
PCT Written Opinion from PCT/GB2016/051360, dated Jun. 1, 2017, 6 pgs.
PCT Written Opinion from PCT/GB2016/051428, dated Jun. 2, 2017, 12 pgs.
PCT Written Opinion from PCT/GB2016/051615, dated May 17, 2017, 5 pgs.
PCT Written Opinion from PCT/GB2016/051759, dated May 18, 2017, 6 pgs.
US Notice of Allowance from U.S. Appl. No. 15/186,134 dated Mar. 14, 2017, 8 pages.

* cited by examiner

ANTENNA APPARATUS AND METHOD OF CONFIGURING A TRANSMISSION BEAM FOR THE ANTENNA APPARATUS

CROSS-REFERENCE TO OTHER APPLICATIONS

This application claims priority under 35 U.S.C. 119(b) to UK Application No. 1511200.6, filed 25 Jun. 2015 and entitled "STEERABLE ANTENNA SYSTEM", and to UK Application No. 1519228.9, filed 30 Oct. 2015 (now GB2539733, issued 28 Dec. 2016), and entitled "AN ANTENNA APPARATUS AND METHOD OF CONFIGURING A TRANSMISSION BEAM FOR THE ANTENNA APPARATUS". Both applications are incorporated by reference herein.

BACKGROUND

The present technique relates to an antenna apparatus that may be used as a base station in a wireless network, and to a method of configuring a transmission beam for such an antenna apparatus.

A wireless network may be provided to serve a range of different functions, but typically includes a number of base stations, with each base station communicating wirelessly with multiple wireless terminals. For instance, in the example of an access wireless network, the wireless terminals may be items of end user equipment, and each base station may communicate wirelessly with multiple such items of end user equipment. Another example of a wireless network is a wireless backhaul network (also referred to herein as a wireless feeder network), where each wireless terminal (also referred to herein as a feeder terminal) is typically coupled to an access point of an access network, and those wireless terminals then communicate wirelessly with one or more base stations, also referred to herein as feeder base stations. The feeder base stations are then used to connect the wireless backhaul network to a core network.

Within a wireless network, a base station may need to use a transmission beam that facilitates transmitting signals to a number of different wireless terminals that will typically be spread out within a geographical area serviced by the base station. The quality of the link provided between the base station and the various wireless terminals can be affected by a number of factors, such as the environment in which the wireless network is deployed (for example in a densely populated urban environment there can be many physical structures that will attenuate signals), interference from other wireless signals being transmitted within the deployment area, etc.

It would hence be desirable for a base station in a wireless network to be able to self configure its transmission beam so as to seek to reduce the potential adverse effects on link quality due to such factors.

SUMMARY

In a first example configuration, there is provided an antenna apparatus for operating as a base station in a wireless network, comprising: a rotatable antenna assembly configured to employ a transmission beam pattern selected from a plurality of transmission beam patterns; a controller to rotate the rotatable antenna assembly in order to alter an azimuth direction of the rotatable antenna assembly; the controller being configured, during a configuration mode, to perform a sweep operation in order to rotate the rotatable antenna assembly to each of multiple selected azimuth directions; quality metric determination circuitry to determine, for each selected azimuth direction, a link quality metric for each of a plurality of wireless terminals based on communication between the plurality of wireless terminals and the base station whilst the rotatable antenna assembly is at that selected azimuth direction; and transmission beam determination circuitry to determine, from the link quality metrics determined for the plurality of wireless terminals at each selected azimuth direction, both an output transmission beam pattern from said plurality of transmission beam patterns, and an output azimuth direction; for a subsequent communication with the plurality of wireless terminals, the controller being arranged to rotate the rotatable antenna apparatus to said output azimuth direction and the rotatable antenna assembly being arranged to employ said output transmission beam pattern.

In accordance with the above embodiment, the antenna apparatus has a rotatable antenna assembly that can adopt a number of different azimuth directions, and which in addition can employ a number of different transmission beam patterns, hence providing significant flexibility in both the underlying physical direction in which the antenna assembly points and in the actually transmission beam pattern issued. During a configuration mode, a controller within the antenna apparatus is arranged to perform a sweep operation during which the rotatable antenna assembly is rotated to each of multiple different azimuth directions. For each selected azimuth direction, a link quality metric is determined for each of a plurality of wireless terminals that the base station is arranged to communicate with. Transmission beam determination circuitry then determines from the various link quality metrics both a transmission beam pattern and an azimuth direction to be used for subsequent communication with the plurality of wireless terminals.

The base station needs to facilitate point-to-multipoint communication, due to the need for it to communicate with multiple wireless terminals, and the aim of the configuration operation performed during the configuration mode is to seek to determine a combination of azimuth direction and transmission beam pattern that will provide a desirable level of link quality with each of the various wireless terminals. In one particular embodiment, the computation performed by the transmission beam determination circuitry seeks to take into account the link quality requirements of each of the various wireless terminals whilst seeking to minimise adverse effects on the link quality from factors such as the earlier-mentioned environmental and interference conditions.

In one embodiment, each of the wireless terminals may be viewed equally when assessing a suitable azimuth direction and transmission beam pattern to select. However, in an alternative embodiment the transmission beam determination circuitry is arranged to receive weighting information associated with at least one wireless terminal, and is arranged to utilise the weighting information in combination with the link quality metrics when determining the output azimuth direction and the output transmission beam pattern to be used for the subsequent communication. This effectively enables some wireless terminals to be prioritised over others, so that it can seek to be ensured that any combination of azimuth direction and transmission beam pattern chosen meets certain predetermined requirements in terms of link quality for those prioritised wireless terminals. In one embodiment, the weighting information may be specified for each of the wireless terminals, and could for example be expressed as a relative weighting of each wireless terminal relative to the other wireless terminals.

The weighting information can take a variety of forms, but in one embodiment is an indication of a level of service to be provided to at least one of the wireless terminals. Such level of service indications may be expressed in terms of Quality of Service (QoS) levels for the various wireless terminals.

There are a number of ways in which the transmission beam determination circuitry can analyse the various link quality metrics in order to determine a suitable transmission beam pattern and azimuth direction to be used for subsequent communication with the plurality of wireless terminals. However, in one embodiment the transmission beam determination circuitry is configured to perform a harmonic mean operation using as inputs the link quality metrics determined for the plurality of wireless terminals at each selected azimuth direction, and the plurality of transmission beam patterns, in order to determine the output azimuth direction and the output transmission beam pattern to be used for the subsequent communication. It has been found that by performing a harmonic mean operation based on the determined link quality metrics, this can enable an optimum combination of azimuth direction and transmission beam pattern to be determined for the base station, having regard to the link quality requirements of the various wireless terminals with which the base station needs to communicate.

In embodiments where weighting information is also provided for one or more wireless terminals, the harmonic mean operation may take the form of a weighted harmonic mean operation, hence enabling the relative link quality requirements for the various wireless terminals to be taken into account when choosing a suitable transmission beam pattern and azimuth direction for subsequent communication.

The link quality metric can take a variety of forms but in one embodiment is a throughput indication for the associated wireless terminal. The throughput indication can take a variety of forms, but in one example is a spectral efficiency value calculated for a link. Such throughput indications can be calculated from a variety of different measured properties, but in one embodiment are calculated from signal to noise ratio measurements, for example a CINR (Carrier to Interference plus Noise Ratio) measurement.

The rotatable antenna assembly may be configured to employ a predetermined transmission beam pattern during the configuration mode. In one embodiment, that predetermined transmission beam pattern may be one of the transmission beam patterns that could potentially be selected by the transmission beam determination circuitry. Typically, the plurality of transmission beam patterns available will include some that have a narrower beam width than others. In one embodiment, one of the transmission beam patterns with a relatively narrow beam is chosen for the configuration mode, as this provides higher gain, along with providing a transmission beam that is less prone to interference. By using a relatively narrow transmission beam during the configuration mode, this provides better directional resolution in the link quality metric information obtained during the process.

During the configuration mode, the rotatable antenna assembly will also employ a reception beam pattern in association with a reception beam that is used to receive communications from the wireless terminals. The chosen reception beam pattern can take a variety of forms. However, in one embodiment the reception beam pattern is chosen to be the same as the predetermined transmission beam pattern used during the configuration mode.

The transmission beam determination circuitry may operate in a number of different ways. In one embodiment the link quality metrics determined for the plurality of wireless terminals at each selected azimuth direction form a link quality metric/azimuth spectrum for the predetermined transmission beam pattern. The transmission beam determination circuitry may then be arranged, based on the link quality metric/azimuth spectrum for the predetermined transmission beam pattern, to perform an extrapolation operation to determine, for each of the plurality of transmission beam patterns, a corresponding link quality metric/azimuth spectrum. By such an approach, this can avoid the need for the quality metric determination circuitry to repeat the quality metric determination process for multiple possible transmission beam patterns.

In one embodiment, prior to performing the extrapolation process the transmission beam determination circuitry uses peak quality metric information within the link quality metric/azimuth spectrum for the predetermined transmission beam pattern to determine, for each of the plurality of wireless terminals, a direction of arrival of the transmission beam from the antenna apparatus. This information then assists in the extrapolation process.

In one embodiment the transmission beam determination circuitry is arranged during performance of the harmonic mean operation to compute a harmonic mean function for each of the plurality of transmission beam patterns using the corresponding link quality metric/azimuth spectrum in order to obtain for each of the plurality of transmission beam patterns an indication of how link quality varies with azimuth. The transmission beam determination circuitry may then be arranged to select as the output azimuth direction and the output transmission beam pattern the combination of transmission beam pattern and azimuth direction that provides a highest link quality indication. This provides an efficient mechanism for computing an optimal combination of transmission beam pattern and azimuth direction.

The link quality metrics determined by the quality metric determination circuitry may relate to a variety of communications between the base station and the various wireless terminals during the configuration mode. In one embodiment, the link quality metric may relate to a downlink communication from the base station to the associated wireless terminal, the quality metric determination circuitry being configured to determine the link quality metric from information received from the associated wireless terminal whilst the rotatable antenna assembly is at the selected azimuth direction. Hence, by way of example, in such an embodiment the wireless terminal may measure one or more characteristics of the downlink signal that it receives from the base station, and then provide that information in a subsequent uplink communication to the base station, so that the base station is provided with sufficient information to determine a link quality metric for the downlink communication.

The wireless network can take a variety of forms, but in one embodiment is a wireless backhaul network for coupling a core network to a wireless access network, and the base station is a feeder base station for connection to the core network. In one such embodiment, at least one of the wireless terminals is a feeder terminal for connection to an access point of the wireless access network. Whilst in one embodiment each of the wireless terminals may be such a feeder terminal, in other embodiments some of the wireless terminals may be provided for other functions. For example, some of the wireless terminals may be relay terminals used to relay signals from the base station to further wireless terminals.

There are a number of ways in which such a wireless backhaul network can be deployed. In one embodiment, such a wireless backhaul network is deployed in a licence-exempt frequency band. Due to its free availability, the lack of official regulation in such an unlicensed band means that the wireless backhaul network is likely to be subjected to various interference sources along with other unpredictable factors that could affect link quality, and hence the above described mechanism for automatically configuring the transmission beam pattern and the azimuth direction of the rotatable antenna assembly is particularly beneficial within such an embodiment.

The various selected azimuth directions employed during the configuration mode can be chosen as desired. However, in one embodiment, the rotatable antenna assembly is capable of being rotated through 360°. In one such embodiment, the multiple selected azimuth directions employed during the sweep operation are regularly spaced within a 360° range of rotation. This hence enables data to be obtained with regards to link quality metrics at representative azimuth directions throughout the full range of rotation. In a particular example, the selected azimuth directions are spaced 15° apart throughout the 360° range of rotation. If desired, extrapolation techniques can be used to infer link quality metric information for other azimuth directions between the selected azimuth directions.

In one embodiment, the configuration mode testing is deemed to have completed once the last selected azimuth direction has been tested, whereafter the transmission beam determination circuitry can then determine the most appropriate combination of azimuth direction and transmission beam pattern based on the determined link quality metrics.

The wireless terminals with which the base station communicates can take a variety of forms. For example, they may or may not be able to employ multiple different beam patterns in respect of their antenna assemblies, and may or may not have the ability to mechanically rotate their antenna assemblies. However, in one embodiment the wireless terminals do have a rotatable antenna assembly and hence have the capability of rotating their antenna assemblies to various different azimuth directions.

In accordance with one such embodiment a system may be provided which comprises an antenna apparatus for operation as a base station in a wireless network, as per the embodiments described above, and a plurality of wireless terminals for communication via the wireless network with the base station. At least one of the wireless terminals has a wireless terminal rotatable antenna assembly which, during the configuration mode, is swept through multiple wireless terminal azimuth directions whilst the rotatable antenna assembly of the base station is at each selected azimuth direction, in order to detect a preferred wireless terminal azimuth direction for each selected azimuth direction. The quality metric determination circuitry of the base station is then configured to determine, for each selected azimuth direction, the link quality metric for each of said at least one of the wireless terminals based on communication between said at least one of the wireless terminals and the base station whilst the rotatable antenna assembly is at that selected azimuth direction and said at least one of the wireless terminals is at its preferred wireless terminal azimuth direction.

Hence, in accordance with such embodiments, some of the wireless terminals may also perform sweep operations, but at a faster rate than the sweep operation being performed by the base station. In particular, for each selected azimuth direction of the base station's antenna assembly, such a wireless terminal will rotate its antenna assembly through multiple wireless terminal azimuth directions in order to detect a preferred wireless terminal azimuth direction given the selected azimuth direction of the base station. That preferred wireless terminal azimuth direction will then be adopted for the communications with the base station, and the link quality metrics determined accordingly.

In some embodiments, it may also be the case that the wireless terminals can adopt multiple different beam patterns for either or both of their transmission and reception beams. In situations where the wireless terminals can potentially use different transmission and/or reception beams, then in one embodiment a predetermined transmission beam and reception beam is chosen for use by the wireless terminal during the configuration mode. As with the earlier described example of the base station, it will typically be the case that a relatively narrow beam pattern will be chosen, as this provides the best resolution for the configuration process.

In one embodiment, any such wireless terminal that has a wireless terminal rotatable antenna assembly as described above may be arranged to measure a downlink quality metric at each of the multiple wireless terminal azimuth directions, and select the preferred wireless terminal azimuth direction based on the measured downlink quality metrics.

In one such embodiment, the quality metric determination circuitry of the base station is configured to receive from said at least one of the wireless terminals information indicative of the measured downlink quality metric at the preferred wireless terminal azimuth direction. Hence, in such embodiments, the base station is provided with a downlink quality metric for the preferred wireless terminal azimuth direction.

The configuration mode can be invoked in a variety of scenarios. In one embodiment, it is envisaged that the configuration mode will form part of the bootstrap process performed by the base station at boot time, in order to enable the base station to determine an appropriate azimuth direction and transmission beam pattern to use for communication with the plurality of wireless terminals following completion of that bootstrap process. However, if desired, the configuration mode could also be re-invoked at other points in time, for example under the control of a central network management module.

From the above discussions, it will be appreciated that, on completion of the configuration operation, a combination of azimuth direction and transmission beam pattern will have been determined for the base station, that will then be used for subsequent communication with the plurality of wireless terminals. In one embodiment the reception beam pattern for the base station can initially be set, following the configuration operation, to be the same pattern as determined for the transmission beam. Thereafter, if desired, subsequent processes employed during use of the base station may cause the reception beam pattern to be varied relative to the transmission beam pattern.

In another example configuration, there is provided a method of configuring a transmission beam for an antenna apparatus to operate as a base station in a wireless network, the antenna apparatus having a rotatable antenna assembly to employ a transmission beam pattern selected from a plurality of transmission beam patterns, and a controller to rotate the rotatable antenna assembly in order to alter an azimuth direction of the rotatable antenna assembly, the method comprising: performing a sweep operation in order to rotate the rotatable antenna assembly to each of multiple selected azimuth directions; determining, for each selected azimuth direction, a link quality metric for each of a plurality of wireless terminals based on communication between the plurality of wireless terminals and the base station whilst the rotatable antenna assembly is at that selected azimuth direction; and determining, from the link quality metrics determined for the plurality of wireless terminals at each selected azimuth direction, both an output transmission beam pattern from said plurality of transmission beam patterns, and an output azimuth direction; for a subsequent communication with the plurality of wireless terminals, rotating the rotatable antenna apparatus to said output azimuth direction and causing the rotatable antenna assembly to employ said output transmission beam pattern.

In a yet further example configuration there is provided an antenna apparatus for operating as a base station in a wireless network, comprising: rotatable antenna means for employing a transmission beam pattern selected from a plurality of transmission beam patterns; control means for rotating the rotatable antenna means in order to alter an azimuth direction of the rotatable antenna means; the control means for performing a sweep operation during a configuration mode in order to rotate the rotatable antenna means to each of multiple selected azimuth directions; quality metric determination means for determining, for each selected azimuth direction, a link quality metric for each of a plurality of wireless terminal means based on communication between the plurality of wireless terminal means and the base station whilst the rotatable antenna means is at that selected azimuth direction; and transmission beam determination means for determining, from the link quality metrics determined for the plurality of wireless terminal means at each selected azimuth direction, both an output transmission beam pattern from said plurality of transmission beam patterns, and an output azimuth direction; for a subsequent communication with the plurality of wireless terminal means, the control means rotating the rotatable antenna means to said output azimuth direction and the rotatable antenna means employing said output transmission beam pattern.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
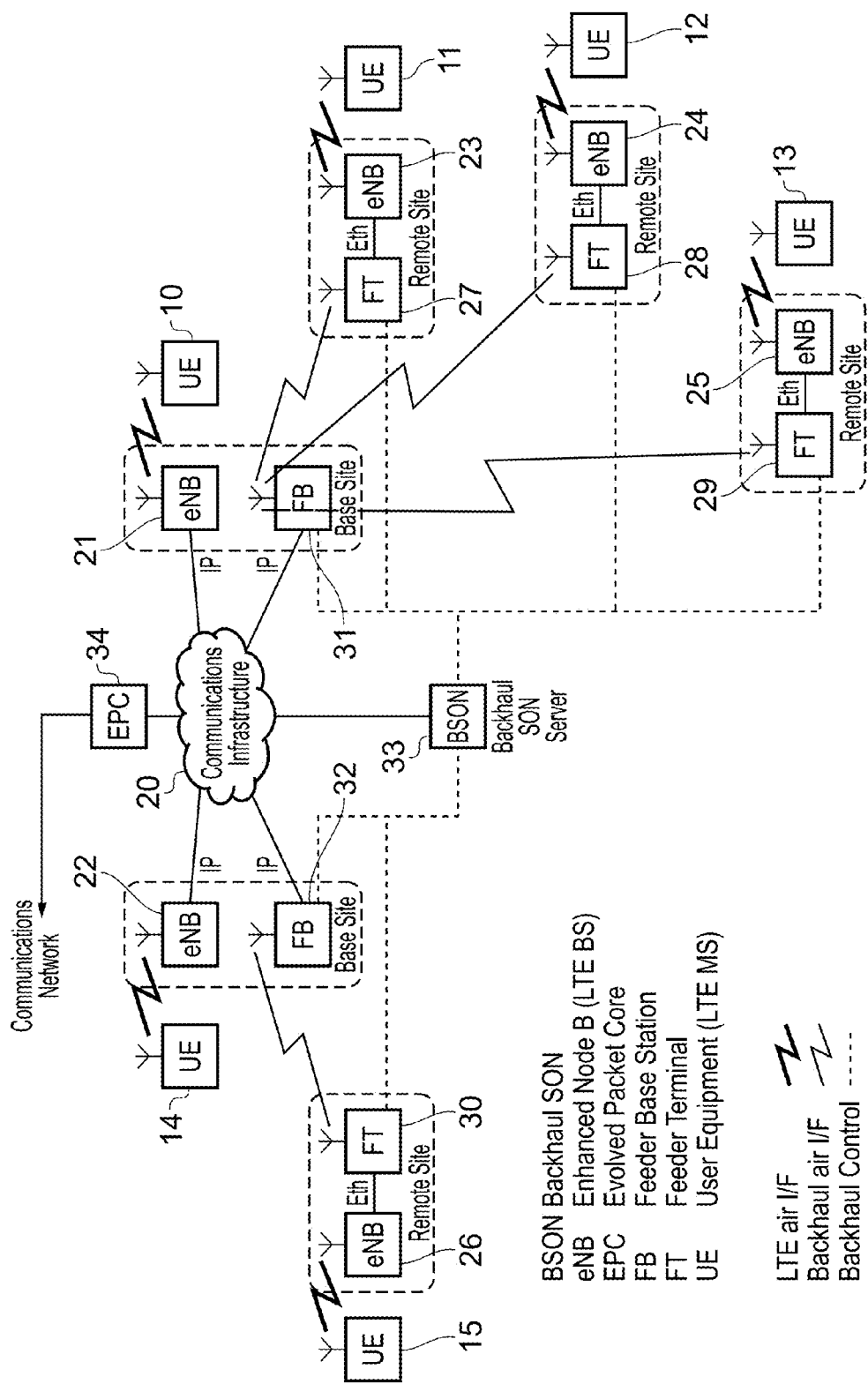
FIG. 1 schematically illustrates a communications network providing connectivity for end user equipment which employs a wireless backhaul network in which antenna apparatuses of some embodiments may be deployed to provide backhaul nodes.

A wireless network may be provided to serve a range of different functions, but one use of a wireless network is to perform backhaul in a communications network where user equipment devices (e.g. mobile telephones) communicate with nodes of the wireless network and the wireless network then enables these nodes to communicate with other nodes of the wireless network, which then connect (typically in a wired manner) to a physical communications infrastructure and then on to a wired communications network such as the internet. There are a number of different use cases and different types of backhaul technologies available to mobile network operators, but in this context there are a number of reasons why it would be desirable to provide nodes of a wireless backhaul network which only communicate with user equipment within a relatively small cell. Small cell deployment can be useful to provide the enhanced quality of service demanded by the ever increasing number of mobile data consumers. Small cells have a number of advantages such as: they allow capacity hot-spots to be targeted to ease congestion, they are appropriate for deploying in a dense outdoor urban environment, for example on street furniture, they can be deployed in specific known "not-spots" where macrocell coverage is poor or within indoor not-spots which experience steady daily traffic with occasional significant peaks, such as dense urban indoor environments like stadiums, shopping malls, and so on. Further, small cells may also be appropriate for mobile deployment, such as in trains, or other moving transport.

In the wireless backhaul use case discussed above, a feeder terminal (FT), i.e. the backhaul node nearest to an access point (AP), which may for example be an eNodeB (eNB) in the context of LTE, may typically be mounted on street furniture or a building façade perhaps 3-6 meters above street level. Conversely, a feeder base (FB), i.e. the backhaul node nearest to the core network, may utilise the same infrastructure as the access macro network.

In view of the above usage context, it is possible that some degree of outage will occur when the backhaul connectivity is unavailable. Outage may for example occur when there is equipment failure, or a persistent or temporary physical obstruction such as heavy rain or vehicles in the line of sight of the backhaul link. Although the use of small cells may enable the target availability of the connectivity to be relaxed, it would advantageous if the nodes of the wireless network were able to reconfigure themselves to provide different communications paths when such outage does occur. Moreover, given the greater number of FTs which need to be deployed when smaller cells are used, in order to facilitate fast, large scale deployment with little engineering required at a new installation site, the ability for the nodes (both FTs and FBs) to self-organise and self-configure is desirable.

In the context of wireless networks, a further consideration which may need to be allowed for is the carrier frequency in which the wireless network operates, both in terms of the corresponding propagation which the carrier frequency allows, but also in terms of the regulatory licencing regimes which apply to a given carrier frequency. Whilst it would be advantageous to provide a wireless network which operates in a licence-exempt frequency band, due to its free availability, the lack of official regulation in such an unlicensed band means that the wireless network must be able to cope with co-channel and adjacent channel interference from unsolicited and uncoordinated wireless sources and furthermore despite any initial well planned deployment, if the wireless network is to be durable (in time) it must be able to adapt rapidly to static or dynamic, fixed or mobile radio traffic from other sources.

Some particular embodiments are now described with reference to the figures. FIG. 1 schematically illustrates a multi-component network which provides connectivity for user equipment (UE) to a communications network such as the internet. The items of user equipment 10-15 of this example communicate wirelessly with LTE base stations—enhanced node Bs (eNBs). These eNBs then either have a direct wired connection (via IP protocol) with the communications infrastructure 20 in the case of 21 and 22, or are connected to an associated feeder terminal (FT) in the case of eNBs 23-26. Each FT is in wireless communication with a feeder base (FB), shown as 31 and 32 in the figure. These FBs are then provided with a wired connection (via IP protocol) to the communications infrastructure 20. Also shown is a backhaul self-organising network (SON) server (controller) 33 which is also shown to be in communication via the dashed line labelled "backhaul control" with the FTs and FBs of the wireless backhaul network, but it should be appreciated that this connection shown is logical and in fact will typically be provided via the wired connection to the communications infrastructure and the wired and/or wireless connection discussed above leading to these FBs and FTs. The communications infrastructure 20 is connected to a communications network (e.g. the internet) via the evolved packet core (EPC) 34. In the particular example of the wireless backhaul network shown in FIG. 1, the nodes (FBs and FTs) are intended to support the provision of relatively small cells, to be easily and rapidly deployable, and to operate well in an unlicensed region frequency band, such that they must be able to cope with co-channel and adjacent channel interference from unsolicited and uncoordinated wireless sources and furthermore be adaptable when the conditions in which they are operating change.

Figure 2:
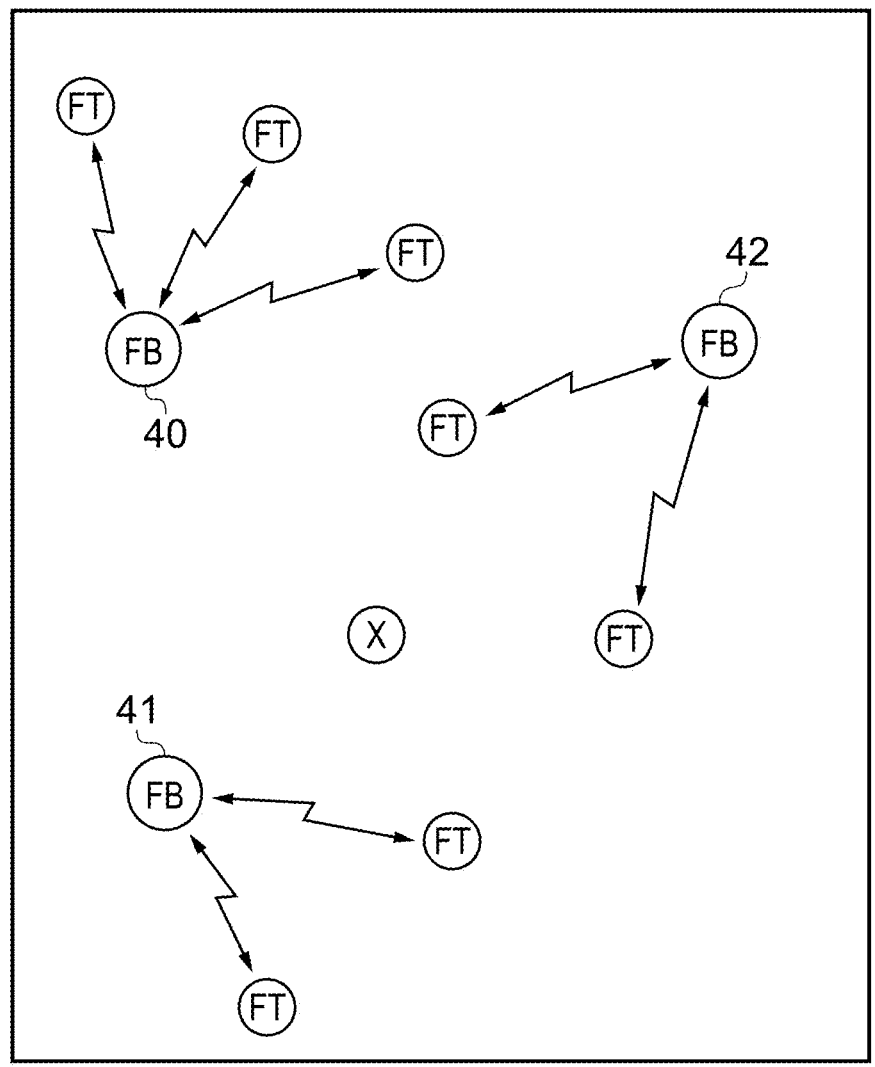
FIG. 2 schematically illustrates a number of feeder bases and feeder terminals in a wireless backhaul network and a source of external interference.

In FIG. 2, seven FTs are shown and three FBs as well as a source of external interference "X". Accordingly, in order to provide good throughput in this wireless backhaul network, this is improved if each node (FT and FB) of the wireless backhaul network are configurable in order to provide a high spectral efficiency. The wireless communication paths shown in FIG. 2 correspond generally to the line of sight (LOS) path between a FB and a FT, and therefore it is advantageous if the antenna provided in association with each FT and FB can be orientated to provide a strong beam in the direction of its communication partner and to suppress interference from other sources. For example, taking FB 40 as an example, it can be seen that if the directionality of its antenna is approximately aligned with the middle FT with which it communicates, but has a sufficiently broad beam width, then good communication throughput with its associated FTs can be achieved without significant interference from the other items in the figure arising. Similarly, the FB 41 can achieve the same by being orientated in a direction lying approximately between the two FTs with which it communicates, and having a beam width with sufficient width to accommodate both the line of sight directions to each of its communication partners. However, in both examples (FB 40 and FB 41), this may further depend of the strength of the external source "X", and if this is sufficiently strong in their direction, the directional orientation of FB 40 and the FB 41 may be better turned slightly away from the source "X", to reduce the interference which it generates. This is potentially a more significant problem for the FB 42, since the external interference source lies between the line of sight directions to its two communications partners. Accordingly, FB 42 may need to be generally orientated in the direction of the external interference source "X" but a beam pattern may be best selected which has a strong null in its central direction, but with reasonably strong lobes in the direction of its communication partner FTs in order to maximise the signal to noise ratio which it can achieve.

Figure 3:
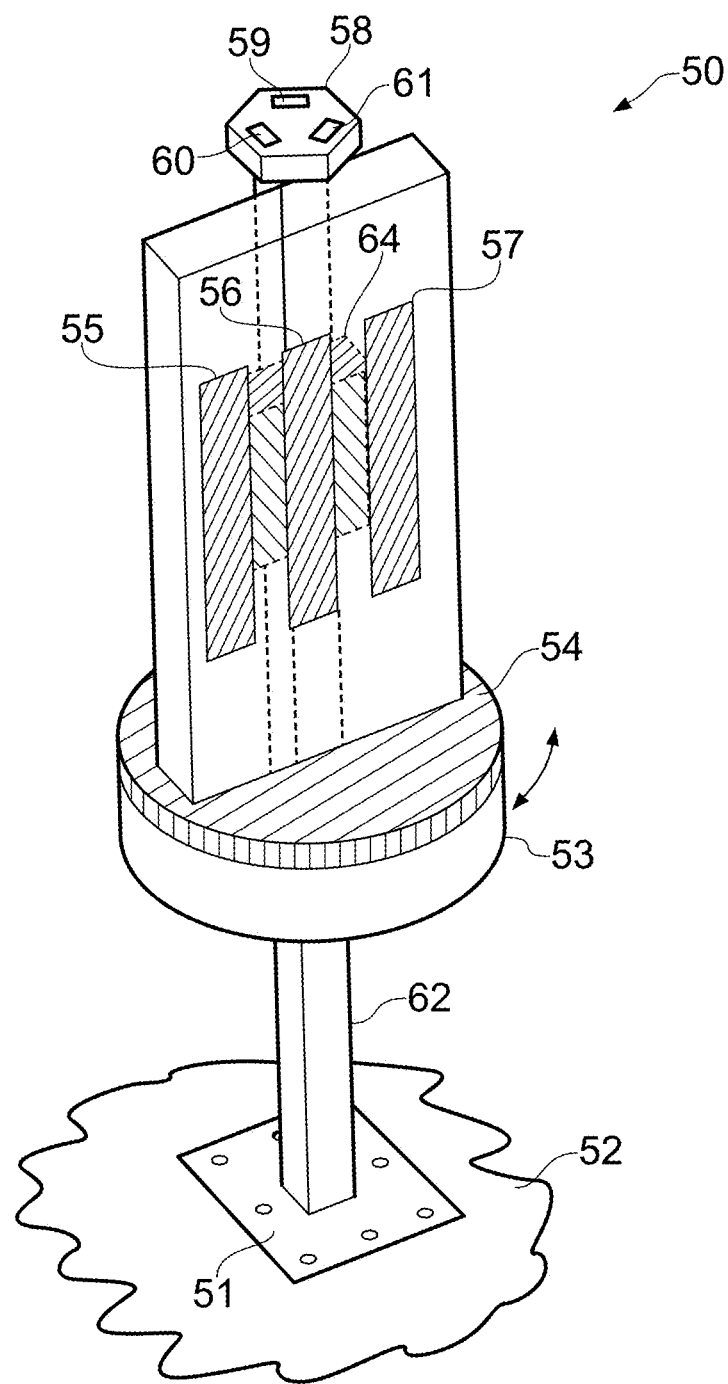
FIG. 3 schematically illustrates an antenna apparatus in one embodiment.

FIG. 3 schematically illustrates the general configuration of an antenna apparatus according to the present techniques, in one embodiment. The antenna 50 has a base plate 51 which enables the antenna to be fixably mounted to its physical location 52. The base plate 51 and the physical location 52 shown is just one example, where in FIG. 3 the physical location 52 is essentially a flat surface, but it should be appreciated that the fixing of the antenna can be provided in a variety of ways, in dependence of the style of configuration which is desired and the type of physical location to which the antenna should be attached. For example, where the antenna should typically be connected to a vertical component such as to the side of a building, street furniture, and so on, a simple mounting bracket directly provided on the side of the base portion 53 may be more appropriate. The base portion 53 remains fixed whilst the rotating portion 54 is able to rotate through at least 360°, by means of a motor within the base portion 53 (not visible in this figure) which causes the rotating portion 54 to be rotated and held at a particular position with respect to the base portion 53. The example antenna 50 has a directional antenna formed of 3 antenna array components 55, 56 and 57, which can be seen in FIG. 3 to be elongate columns. Also visible in FIG. 3 is a circular antenna array 58 formed of 3 antenna components 59, 60 and 61. This is mounted atop the vertical column 62 which runs from the base plate 51 through the antenna apparatus 50, such that the circular antenna is fixed with respect to the physical location 52 of the antenna apparatus, but this need not be the case and other embodiments are conceivable in which the circular antenna is mounted on top of the directional array, so that it rotates therewith. Partially shown in FIG. 3 are the RF electronics 64 which are situated behind the directional array, and couple the antenna array components 55-57 to a transceiver (also not shown). This arrangement wherein the RF chains are physically closely located to the antenna array components means that, despite the rotational capability of the antenna apparatus, good signal fidelity is nevertheless maintained. Only a limited number of signals need be transferred from the rotating RF chain electronics 64 across the rotating interface to the fixed portion 53. It should be appreciated that the antenna apparatus 50 will typically also be provided with a radome cover to protect its components, but this has been removed in the illustration of FIG. 3 for clarity of illustration purposes only.

Figure 4:
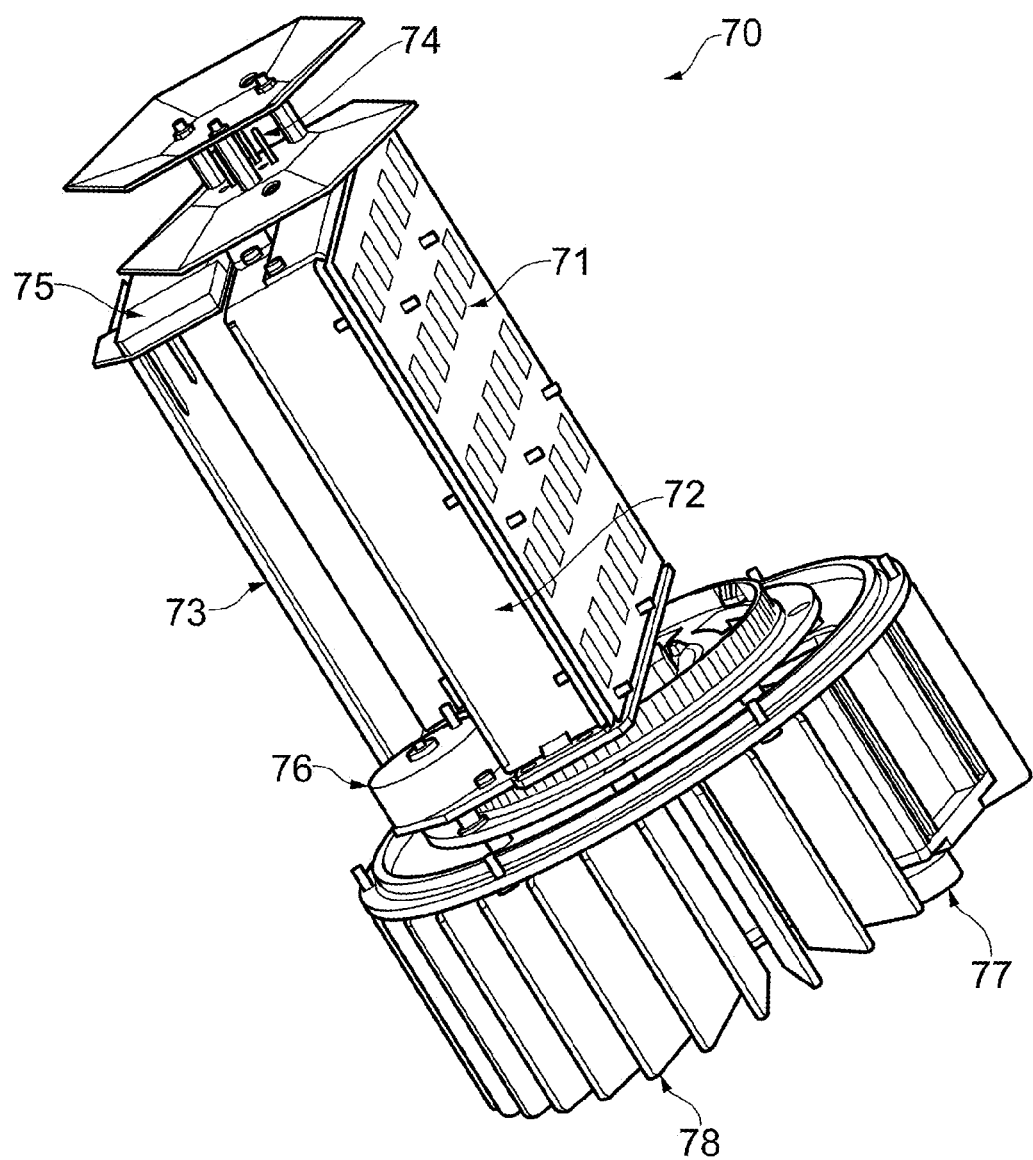
FIG. 4 schematically illustrates an antenna apparatus in one embodiment.

FIG. 4 schematically illustrates in more detail the components of an antenna apparatus 70 in one embodiment. In this embodiment, the directional antenna 71 can be seen to comprise 25 antenna array components arranged in a 5×5 grid. RF and base band electronics (i.e. essentially the RF chains) 72 are provided behind the main directional antenna assembly. These are not directly visible in the illustration of FIG. 4 due to the casing. The antenna 70 further comprises a rear-firing antenna 73 which is orientated in the opposite direction to the front firing main antenna 71. Although not visible in FIG. 4, the rear firing antenna 73 comprises a single column of antenna array elements forming a single antenna array component, which is physically very similar to a single column within the 5×5 array of antenna array elements of the front antenna 71. A circular antenna 74 is mounted on top of the front-firing main antenna 71 and is configured as a triple-monopole antenna which is used, as described above, for assessing the environment in which the antenna 70 finds itself. A further GPS antenna 75 is also provided in the antenna apparatus 70, which is used for node location, orientation and precise time synchronisation. A motorised steering mechanism 76 enables the antenna apparatus to be orientated in any direction in azimuth, and a gigabit Ethernet network interface 77 is provided to connect the antenna further. The fins 78 are for heat dissipation. Note also that the RF and base band electronics 72 mounted behind the front firing main antenna 71 are also connected to the circular antenna 74 and the rear firing antenna 73 as will be discussed in more detail below.

Figure 5A:
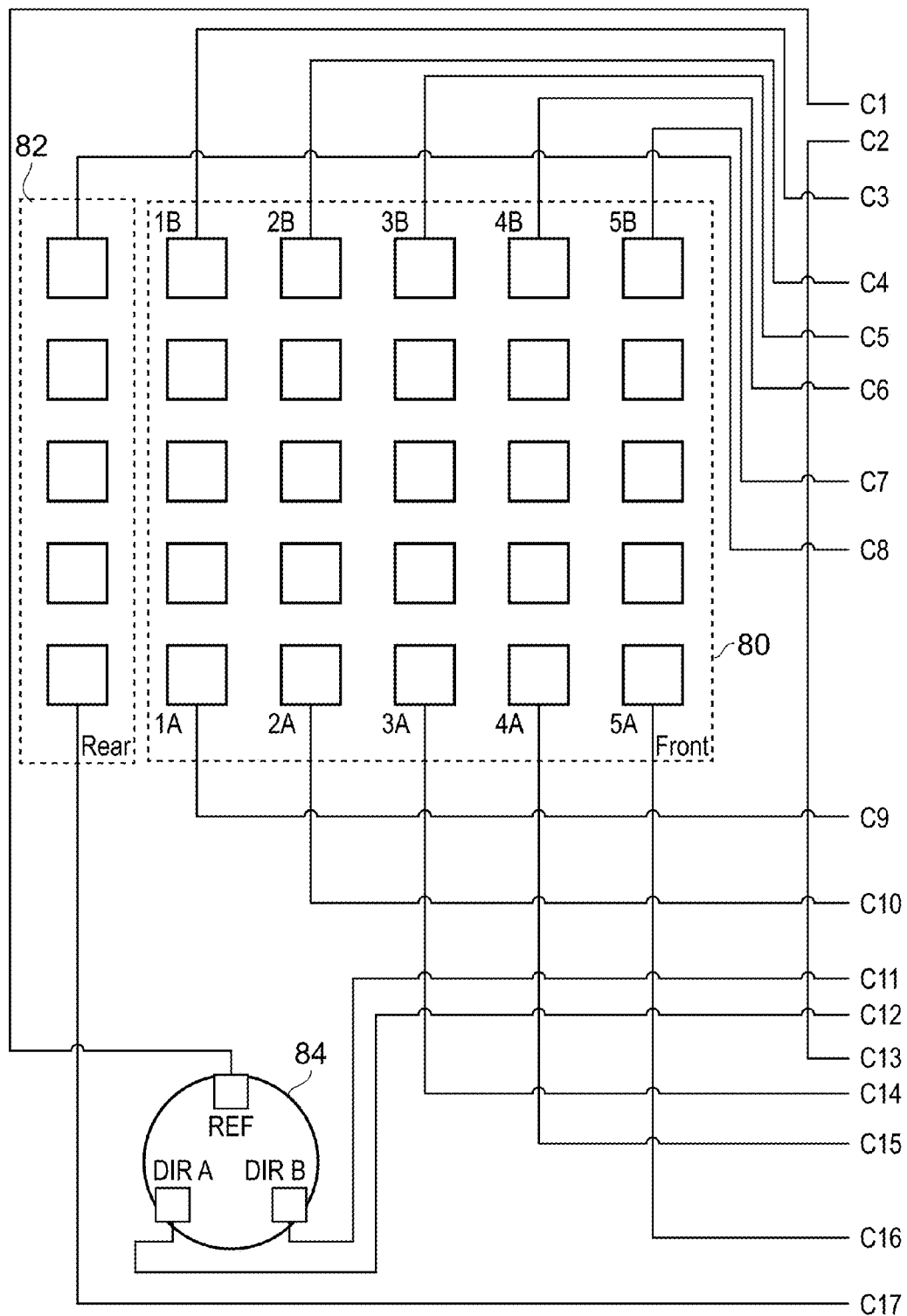
FIGS. 5A, 5B, and 5C schematically illustrate RF chains which are at least partially shared between front, back and circular antenna array components in one embodiment.
Figure 5B:
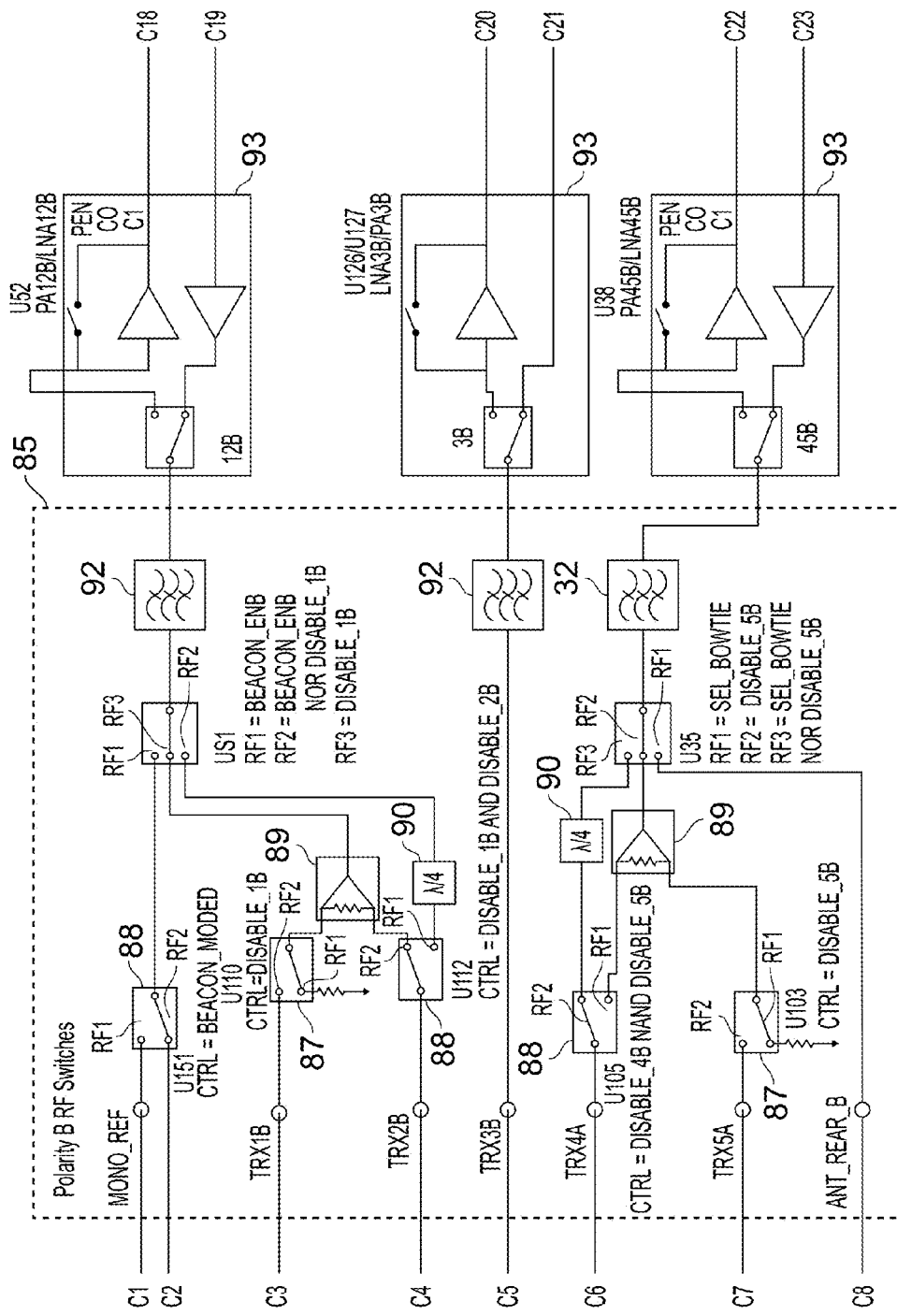
Figure 5B:
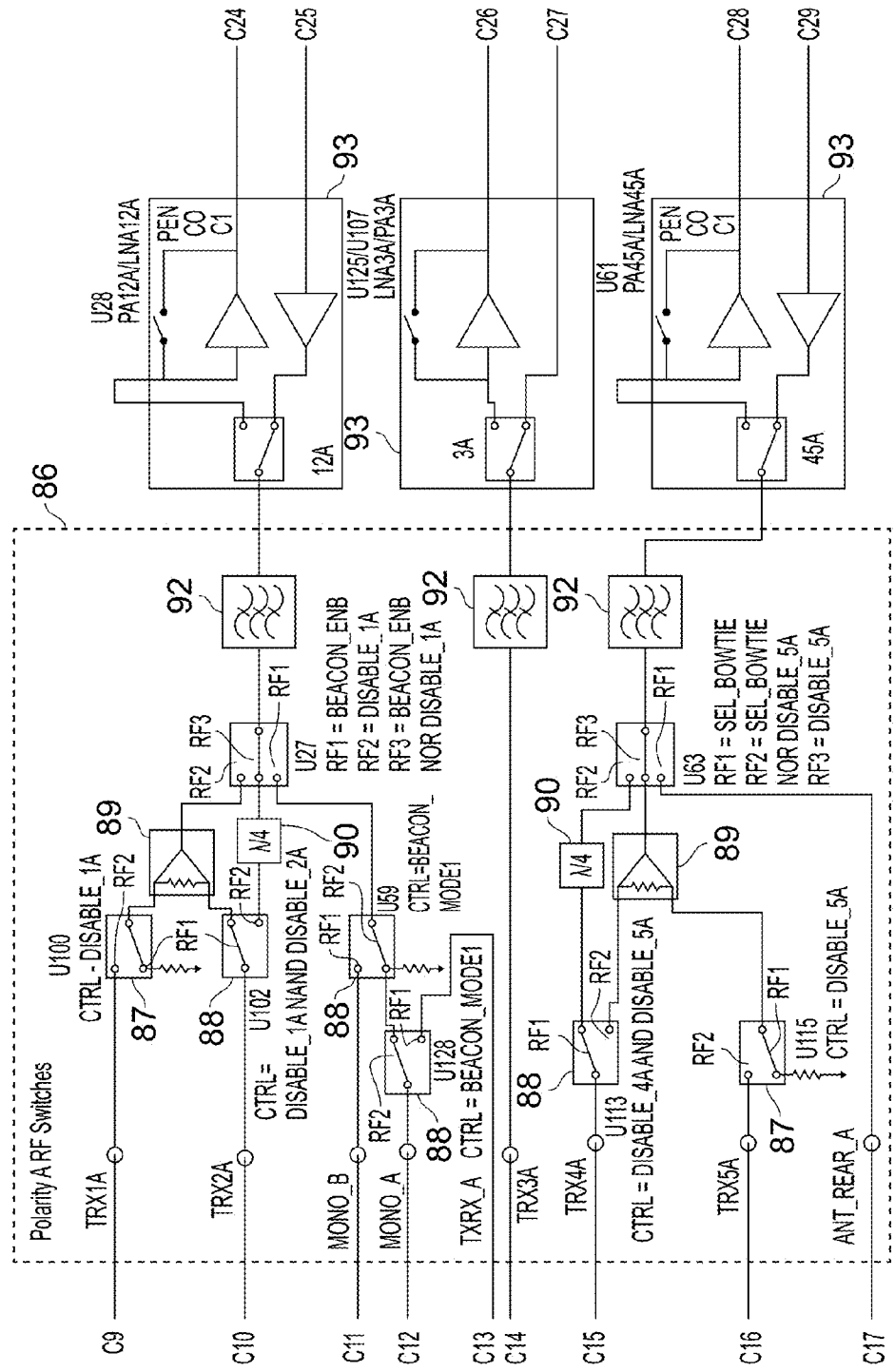
Figure 5C:
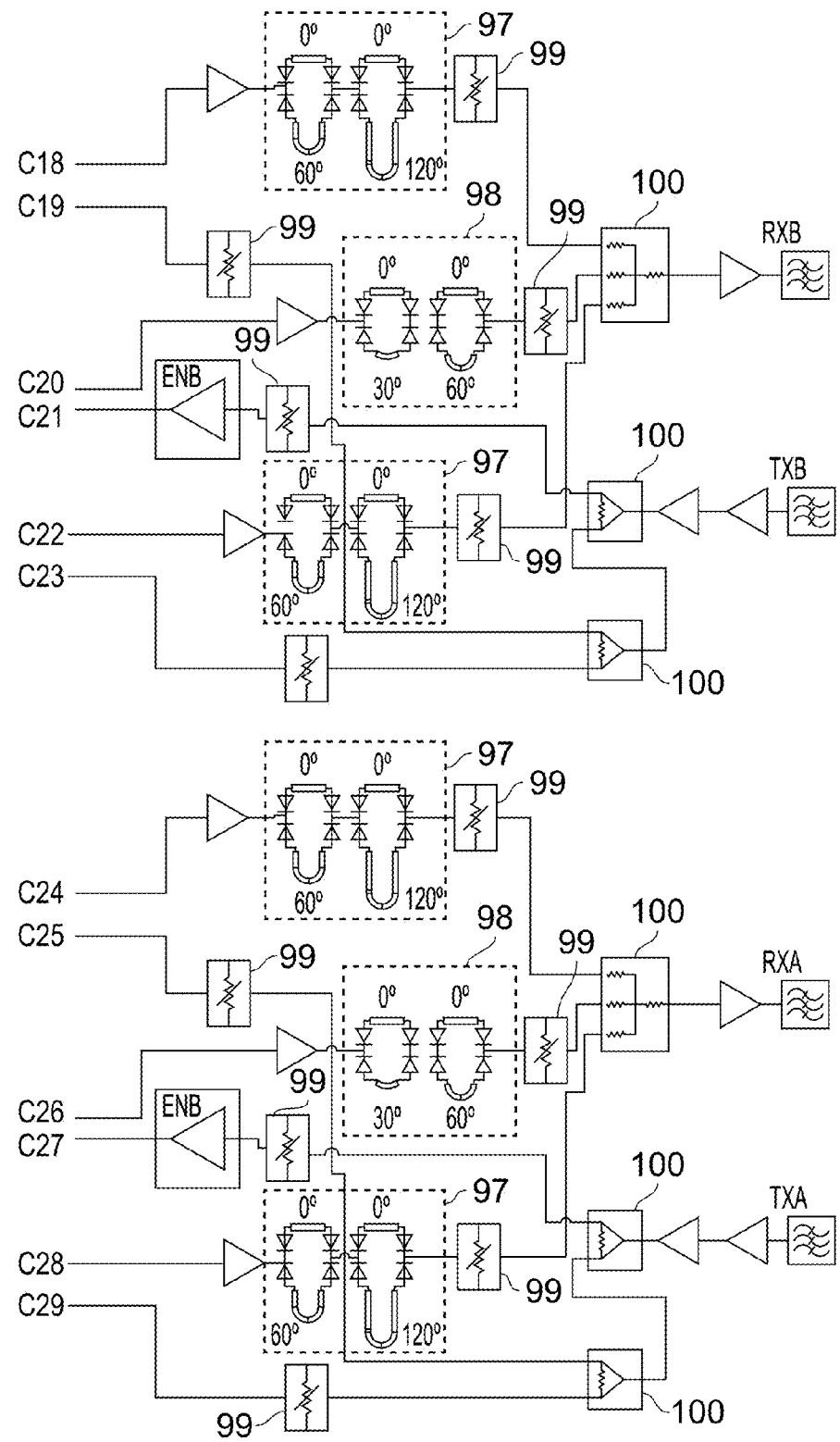

FIGS. 5A-C schematically illustrates the manner in which the RF chains are configured in one embodiment such as that illustrated in FIG. 4. The schematic is split across three sub-figures merely for clarity of illustration. The connections C1-C29 are purely a feature of this manner of illustration, showing how the respective connections continue from one sub-figure to the next. The patch antenna array elements of the front directional antenna are illustrated by the 5×5 set of squares 80 in FIG. 5A. On the left next to these are shown a column of patch elements 82, forming the rear facing antenna. Lower down in FIG. 5A, three antenna array elements 84 are shown, which provide the circular antenna. Turning to FIG. 5B, the nearest components to the array elements are the sets of first and second (A and B) polarity switches 85 and 86. These couple the RF chains to the lower edge (A) of the 5×5 array of patch elements and to its upper edge (B). Two orthogonally polarized signals can thus be applied to all elements of the 5×5 array of patch elements. Note that these sets of polarity switches 85 and 86 also comprise selection switches which either select between the corresponding antenna array component or a terminated input in the case of the selection switches 87, or select between two different possible connection paths for the corresponding array components in the case of selection switches 88. Accordingly, whilst the switching circuitry 88 simply enables certain antenna array components to be enabled or not, the switching circuitry 88 can be seen to provide sharing between the antenna array components for the elements of the RF chain which follow it. Certain pairs of connection paths are paired and feed into the two inputs of summation circuitry 89, which therefore enables both antenna array components to which the summation circuitry 89 may be connected (if both incidences of the switching circuitry 87 and 88 are so set) to be active and summed by the summation circuitry 89. Alternative selectable paths are also provided via the quarter wave-length (λ/4) shifters 90.

Proceeding rightwards in FIG. 5B, the signal 92 thus selected is provided to the set of direction selection circuitry 93 which enables switching between receiver and transmitter modes, only allowing signal transfer in one direction, by virtue of the selection between two directional paths. Thereafter, continuing rightwards to FIG. 5C, each RF chain comprises, for the receiver path, phase shifting circuitry 97 or 98. Each phase shifting circuitry comprises 4 fixed length phase paths which can be selectively engaged to enable phase shifts of 0°, 60°, 120° or 180° in the case of phase shifting circuitry 96, or phase shifts of 0°, 30°, 60°, or 90° in the case of phase shifting circuitry 98. This enables phase ramps of +/−60°, +/−30° and 0° to be applied across the array. FIG. 5C also shows gain circuitry 99, which is provided for each RF chain, both in the transmitter and receiver direction. Variability in the gain applied by these gain stages firstly allows a normalisation in gain variation between the columns (measured and calibrated during manufacture) and secondly, in the case of the central column, the variable gain is advantageous in allowing a fine tuning of main-lobe beam-width and hence adjacent null positions. Finally, each RF chain comprises summation circuitry 100 which enables further sharing of the RF chains.

It will be appreciated from the illustration of FIGS. 5A-C therefore that the sharing of the RF chains enables components of the RF electronics to be shared between the antenna (front, rear and circular) components, enabling a reduced size of RF electronics and cost thereof, in particular due to the shared phase shifting circuitry, such that not only is an antenna apparatus which is cheaper provided, but also one in which the RF electronics can be easily comprised within the portion of the antenna which rotates, and thus in close proximity to the antenna array components. Not only does this improve signal fidelity, it also facilitates the physical rotation of the antennas.

Note also from FIGS. 5A-C that independent RF chains are provided for each polarization allowing the signals transmitted and received by the front and rear antenna to be ±45° polarized, giving two polarizations, where each polarization carries a complex I/Q modulated signal. Note that these orthogonal polarizations are used to carry two streams of MIMO (multiple-in, multiple-out) encoded data, in a manner with which one of ordinary skill in the art will be familiar. It should be noted that the RF feed network could be routed to either edge (top or side) of the array, but merely for physical layout reasons of the particular embodiment shown here, the top/bottom design has been chosen. Various orthogonal polarizations may be employed, just three examples being: +/−45°, vertical/horizontal, and right-hand and left-hand circular polarization. Finally, note that certain combinations of antenna array components cannot be activated simultaneously. This allows further reduction in the number of RF chain components that must be provided by sharing RF chains between these components, yet the present techniques have nevertheless found that a useful range of beam patterns can be provided as will be discussed in some more detail below.

Figure 6:
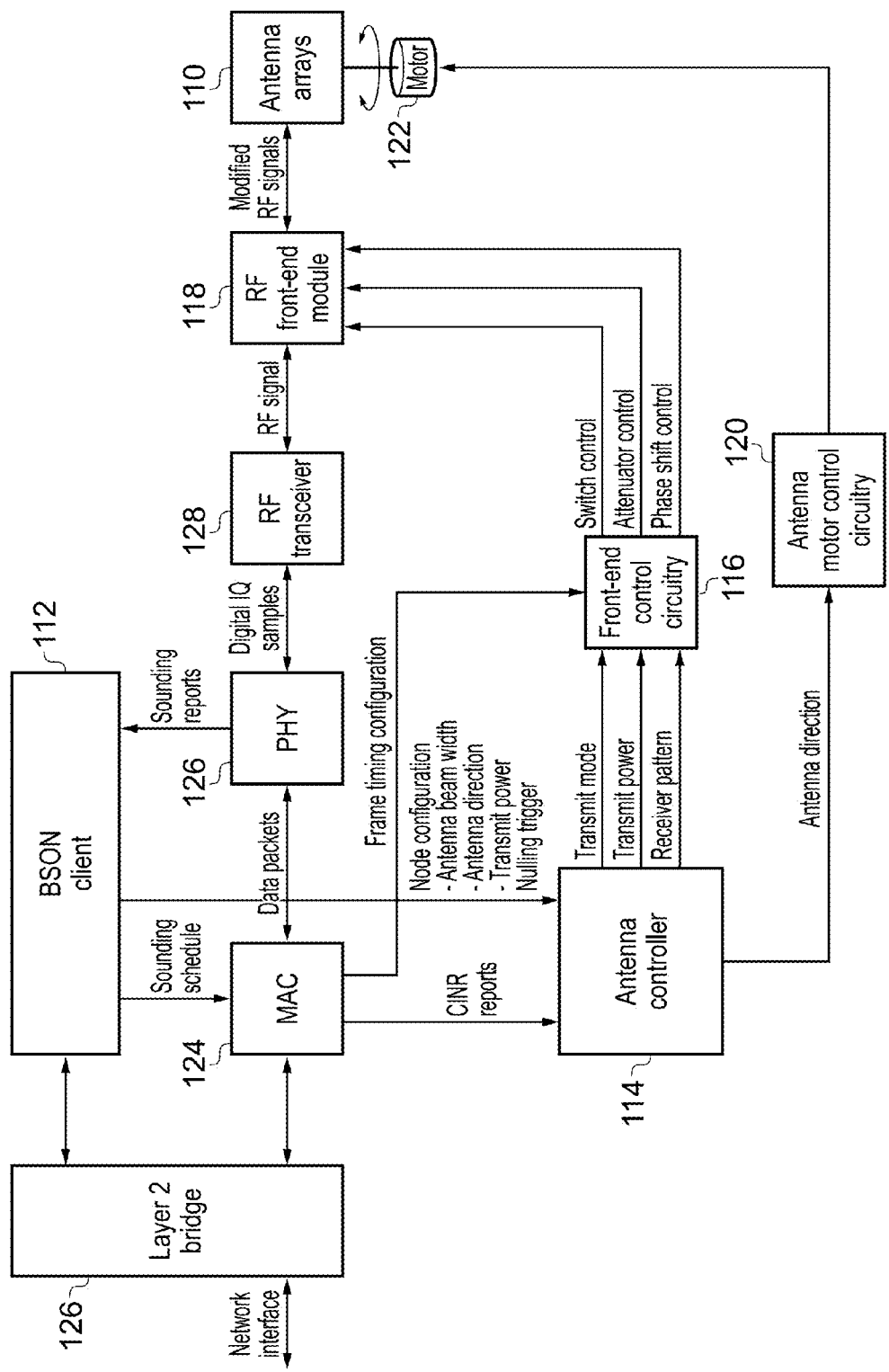
FIG. 6 schematically illustrates control circuitry and signal processing circuitry which are connected to the antenna arrays of one embodiment, both within the antenna apparatus itself and in other network components to which it is connected.

FIG. 6 schematically illustrates the connections of the antenna arrays (front, rear and circular) 110 in one embodiment. The antenna arrays 110 are controlled by some of the other components shown in FIG. 6. A backhaul self-organising network (BSON) client 112 (software running in the same housing as the antenna apparatus) provides node configuration including antenna beam width and direction, and transmit power and a nulling trigger to an antenna controller 114. This BSON client communicates with an external BSON server (not shown in this figure). However, additionally the antenna controller 114 may autonomously select the receiver pattern which maximises throughput based on carrier to interface and noise ratio (CINR) measurements. The antenna controller 114 controls the antenna arrays by passing configuration information for the transmit mode, the transmit power and the receiver pattern to the front end circuitry 116. The front end control circuitry 116 converts these into the required switch control signals, gain control signals and phase shift control signals which are passed to the RF front end module 118. The RF front end module 118 represents the components of FIG. 6 in which the components other than the antenna array components in FIG. 5 are to be found. The antenna controller 114 also indicates an antenna direction to the antenna motor control circuitry 120, which controls the motor 122 in order to orientate the antenna arrays 110 in azimuth. A modem data path is provided comprising the MAC 124, the PHY 126 and the RF transceiver 128, which then couples to the RF front end module 118 in order to provide this with the RF signals which the RF chains modify before passing them to the antenna arrays 110. In other words, data packets are sent between the MAC 124 and the PHY 126, digital IQ samples are passed between the PHY 126 and the RF transceiver 128, and RF signals are exchanged between the RF transceiver 128 and the RF front end module 118. The BSON client 112 (BSON controller) also generates sounding schedules to be implemented by the antenna apparatus which are received by the MAC 124. The MAC 124, like the BSON client 112 communicates with a Layer 2 bridge 126 which is coupled to the network interface.

Figure 7:
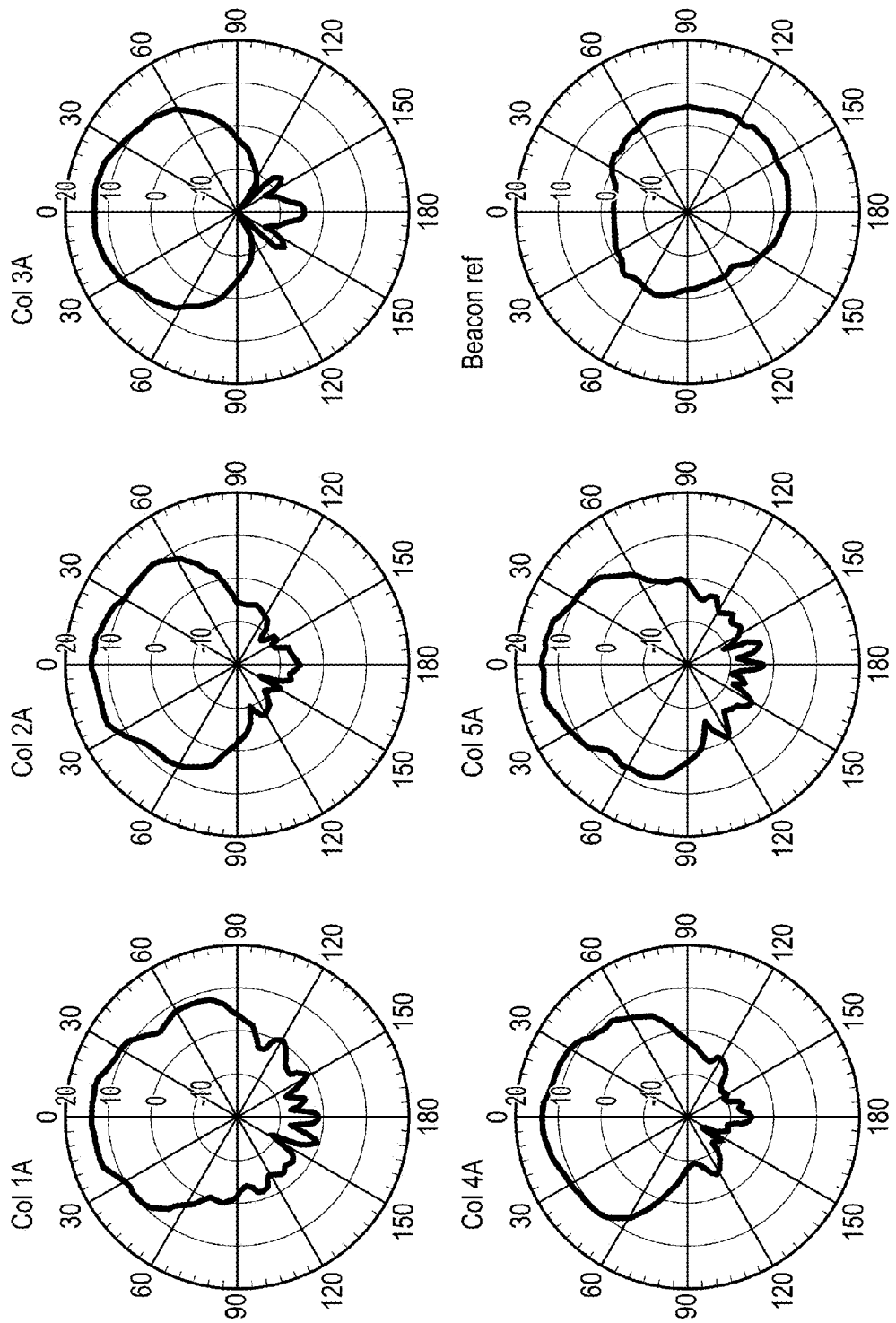
FIG. 7 shows a subset of the beam patterns which are available to an antenna apparatus in one embodiment.
Figure 7:
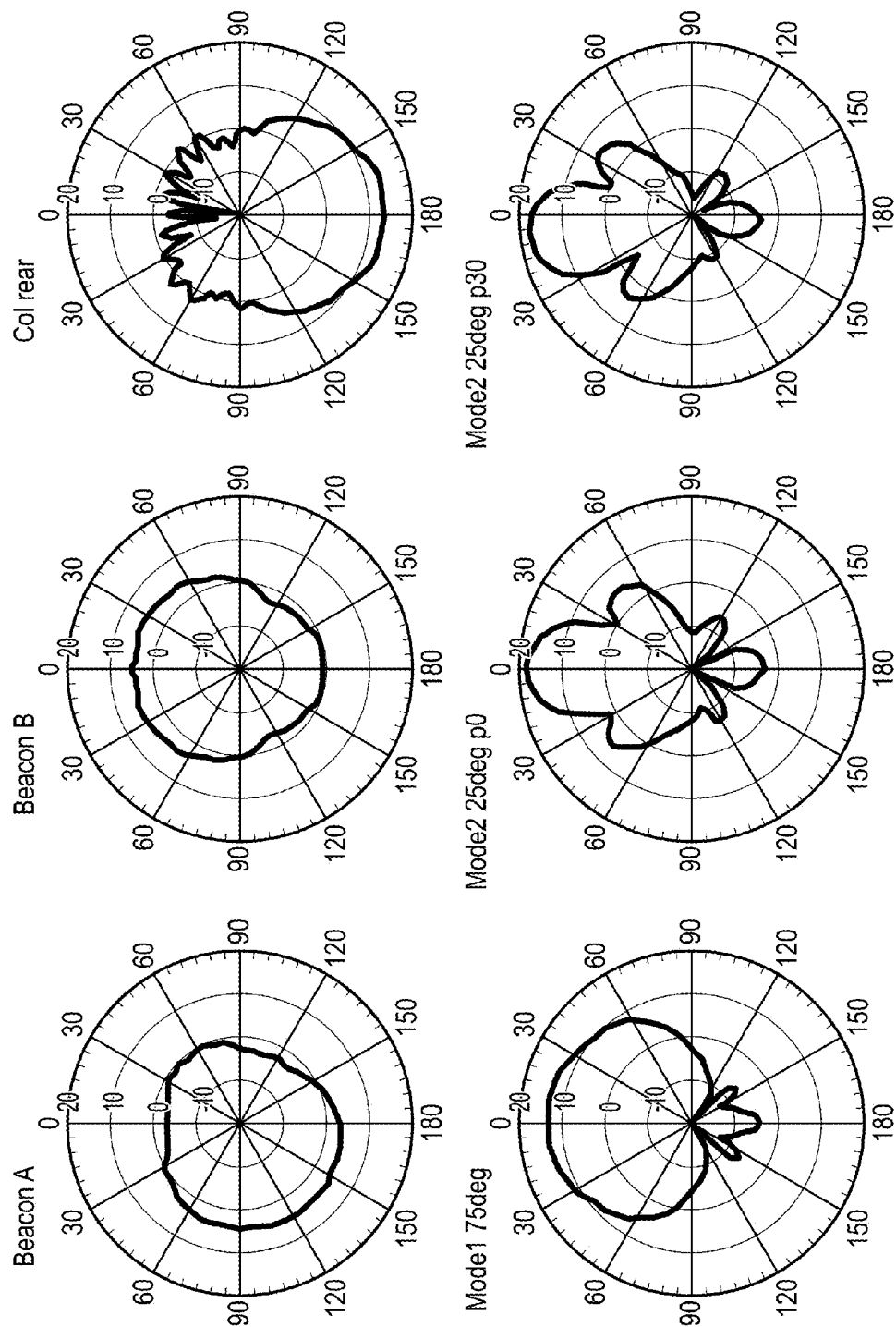
Figure 7:
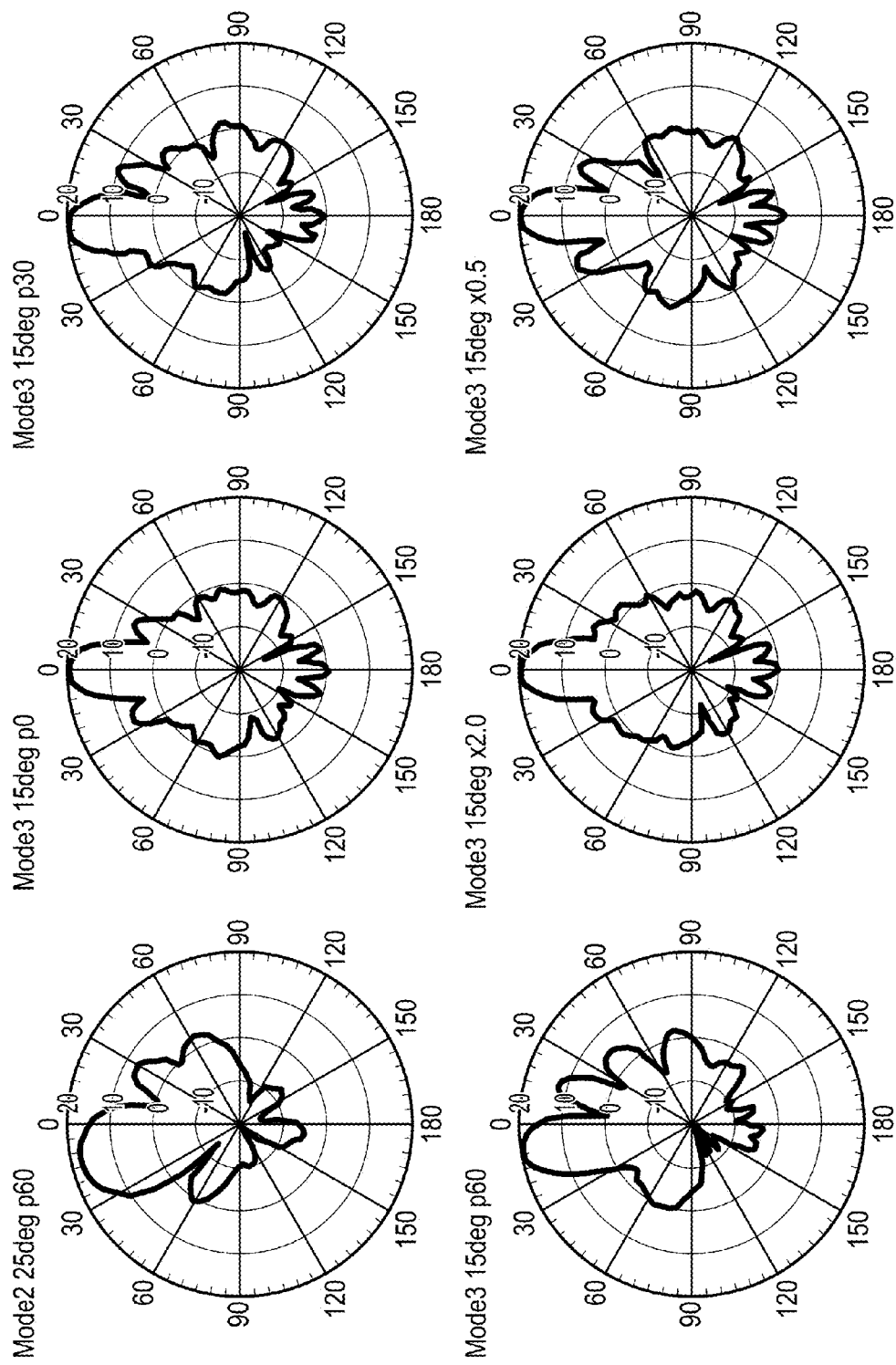
Figure 7:
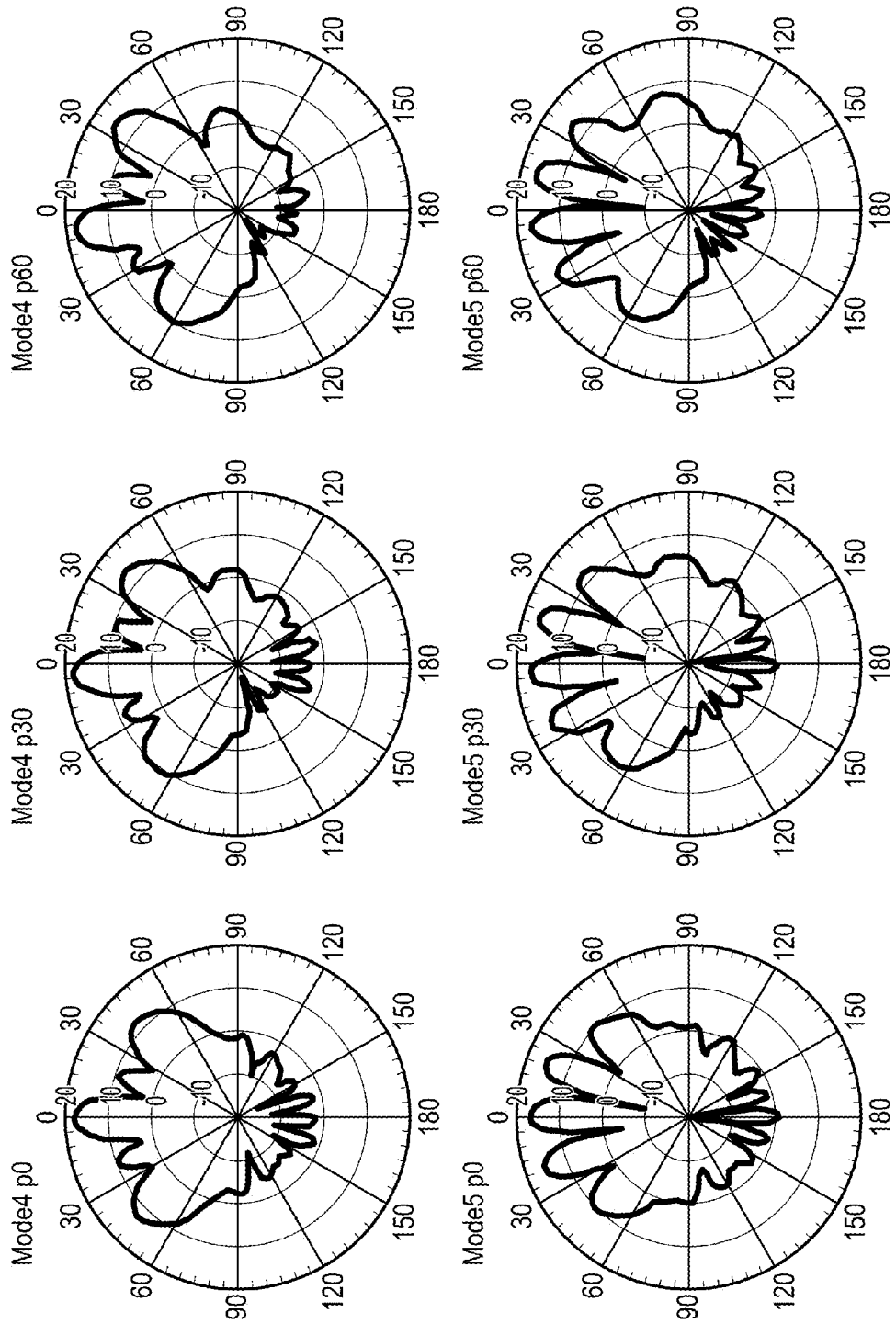
Figure 7:
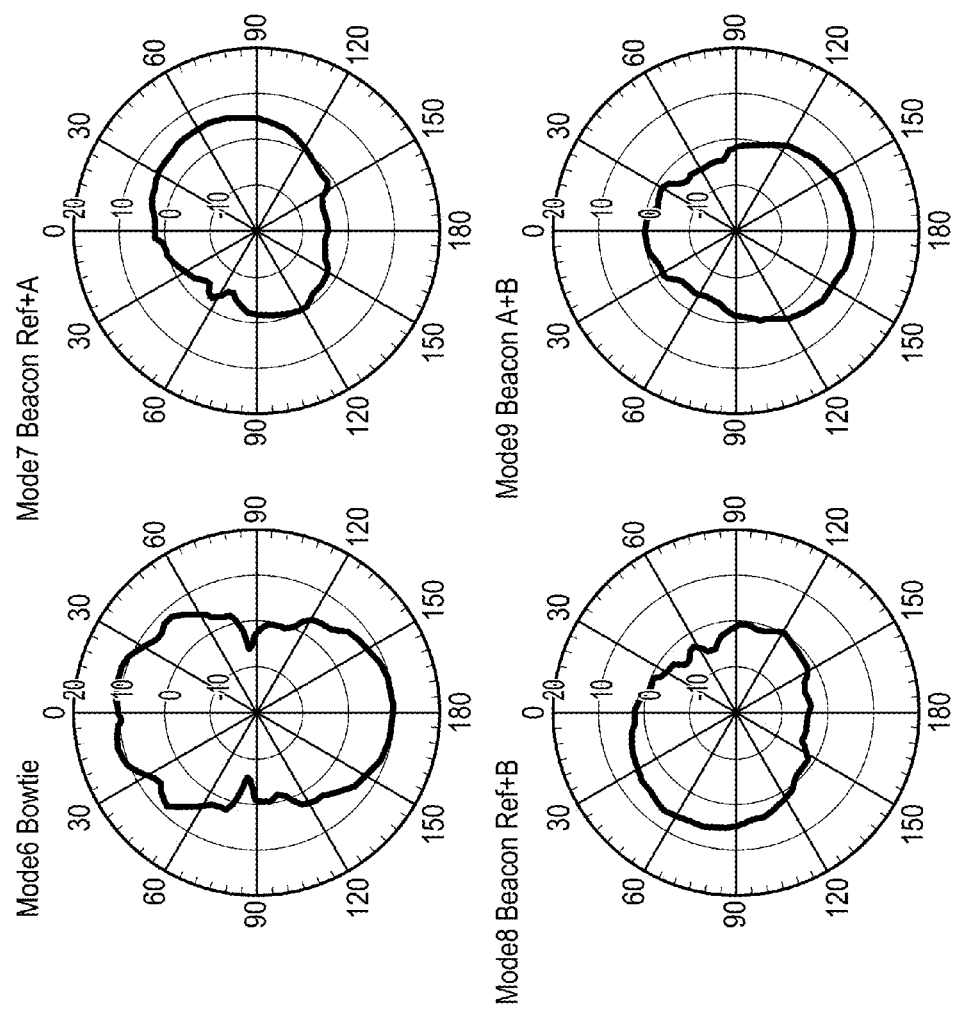

FIG. 7 shows a subset of the beam patterns which can be generated by an antenna array configured such as is illustrated in FIGS. 5 and 6, showing the useful range of beam patterns available. In FIG. 7 the following classes of beam patterns can be identified:

Narrow beams with a single main lobe and of various beam widths, where side lobes are significantly reduced relative to the main lobe;
Electronically steered beams that combine signals at RF, enabling antenna directivity to the left or right of the bore sight of the array;
Beams with grating lobes, where the array pattern has equally strong peaks in multiple directions and deep nulls with significant attenuation (gain<1) in other directions;
A bowtie configuration;
Three 'beacon' omni-directional patterns.

Combined with the above discussed rotating mechanism, the antenna apparatus thus provided, using a fixed set of beam patterns, improves over traditional uniform linear arrays, by being able to maintain a peak gain in any direction. For uniform linear arrays, it is known that the array gain decreases as the angle from the bore sight increases. In addition, the antenna apparatus provided is economically more attractive than more complex circular arrays. For example, ten complete transceiver chains with an aperture of 6.08λ would generate an antenna pattern with 25° beam width. Embodiments of the antenna apparatus described herein have an aperture which is 4λ and use only two transceiver chains (note that the RF chains shown in FIGS. 5A to 5C reduce down to two connections in the receiver direction and two connections in the transmitter direction) and the narrowest beam that can be generated is 15°. Overall therefore the antenna apparatus provided by the present techniques enables the maximum gain to be orientated in any direction in 360°, whilst improving diversity reception and conversely interference nulling from any direction using a rich set of multiple transmitter and receiver beams.

Figure 8:
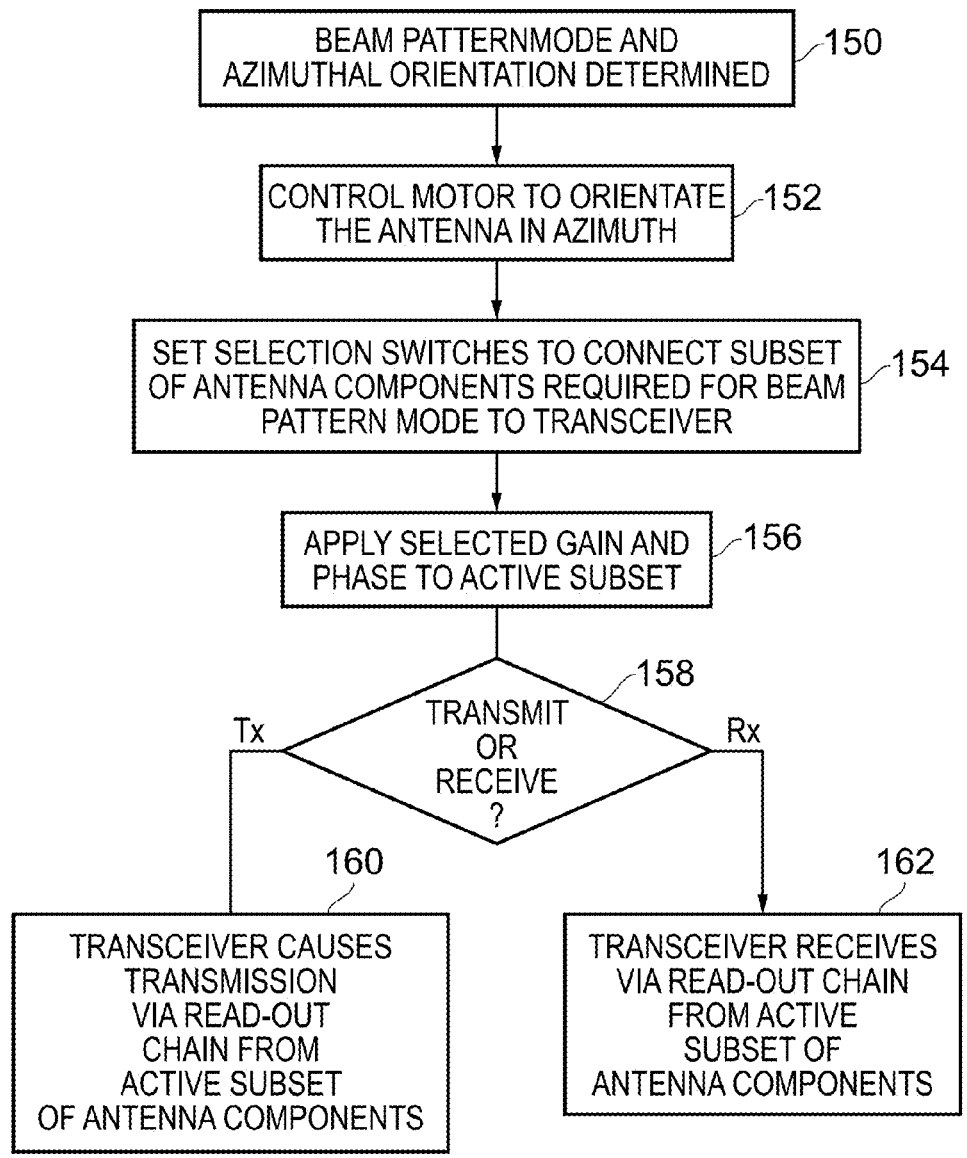
FIG. 8 shows a sequence of steps which are taken when operating an antenna apparatus in one embodiment.

FIG. 8 shows a sequence of steps which are taken in the method of one embodiment. At step 150 a beam pattern mode and azimuthal orientation are determined for the antenna apparatus and at step 152 the motor of the antenna apparatuses control orientates the antenna in azimuth. At step 154 the selection switches of the RF front end module are set to correctly connect a subset of the available antenna components required for the selected beam pattern and mode to the transceiver. Then at step 156 the selected gain and phase are supplied to this active subset by means of switching of the corresponding gain circuitry and phase circuitry in the front end electronics. Then finally, at step 158, if the antenna apparatus is being operated in transmission mode the flow proceeds to step 160 and the transceiver causes transmission via the RF chain from the active subset of antenna components, whereas if the antenna apparatus is being operated as a receiver, then the flow proceeds to step 162 where the transceiver receives via the RF chain from the active subset of antenna components.

A process that may be performed by a feeder base station in a configuration mode, to determine a transmission beam pattern and azimuth direction to employ for subsequent communication with the various feeder terminals that communicate with that feeder base station, will now be described with reference to the following figures. Whilst the technique described hereafter can be applied within the feeder base station as described with reference to the earlier figures, these techniques can also be implemented within other forms of feeder base station provided that those feeder base stations support the use of multiple different transmission beam patterns and azimuth directions. For example, in some embodiments, there is no requirement for the components of the RF electronics to be shared between the antenna components as per the embodiment of FIGS. 5A to 5C. Further, there is no need for the feeder terminals to be constructed as discussed in the earlier embodiments, although for the purposes of the following embodiments it will be assumed that they also can adopt different beam patterns and azimuth directions for their antenna assemblies.

Figure 9:
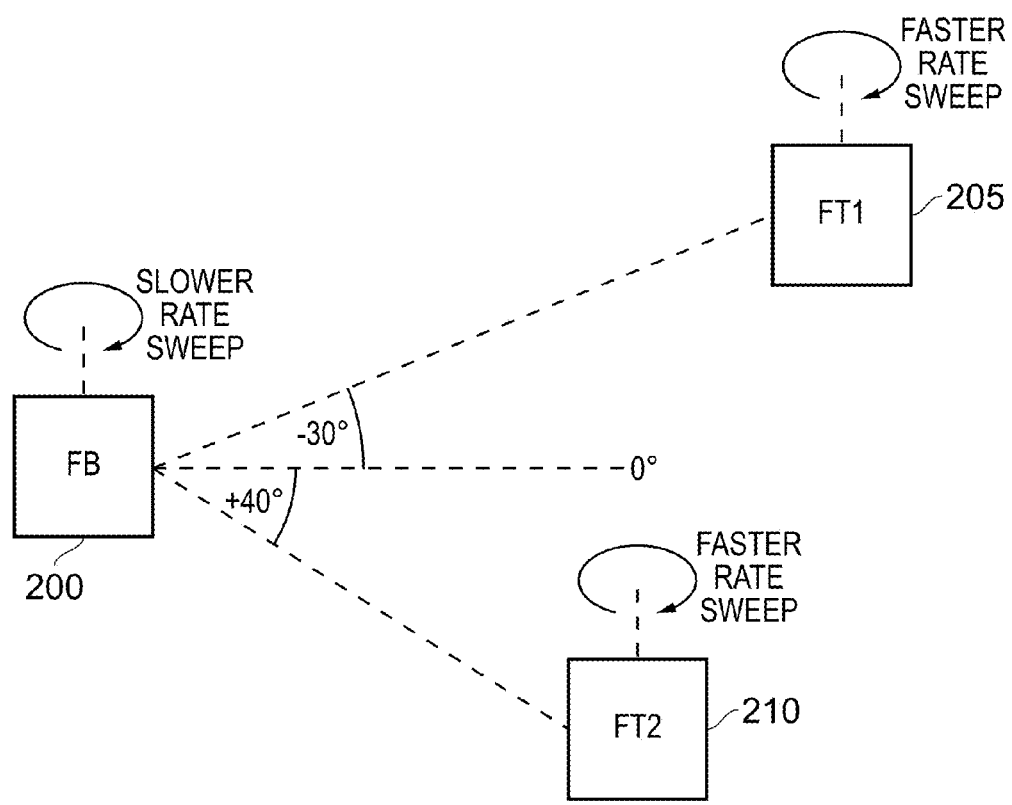
FIG. 9 schematically illustrates a portion of a backhaul network comprising a feeder base station, and multiple feeder terminals arranged to communicate with that feeder base station, as an example of a deployment in which the transmission beam pattern and azimuth direction configuration process of one embodiment can be employed.

FIG. 9 schematically illustrates a portion of a wireless feeder network used to perform backhaul communication. For ease of illustration, a single feeder base station 200 is shown, along with two feeder terminals FT1 205 and FT2 210 that are arranged to communicate with that feeder base station. It will be appreciated that typically an individual feeder base station may be arranged to communicate with more than two feeder terminals, but for ease of illustration only two feeder terminals are considered.

As shown schematically in FIG. 9, the feeder terminals are at different physical distances from the feeder base station, and are offset at different angles with respect to a nominal 0° axis. On initiation of a configuration mode of operation, which may for example be invoked during boot time of the feeder base station 200 as part of the bootstrap process, a configuration process is implemented involving both the feeder base station 200 and its associated feeder terminals 205, 210, in order to seek to determine an appropriate azimuth direction for the rotatable antenna assembly of the feeder base station 200, and an appropriate transmission beam pattern to use for transmission of signals to the feeder terminals. This process will be discussed in more detail with reference to the example embodiment of FIG. 10, but in general summary involves the feeder base station positioning its rotatable antenna assembly at a series of different azimuth directions and, at each of those selected azimuth directions, then transmitting a reference signal in order to seek to establish communication with the feeder terminals, so as to enable a link quality metric to be determined for each of those feeder terminals when that currently selected azimuth direction is used.

In one embodiment, during this process, the feeder base station will adopt a fixed transmission beam pattern. For example the process may select the beam pattern from amongst the available beam patterns that produces a relatively narrow transmission beam. It has been found that choosing a narrow transmission beam pattern provides better resolution in the data obtained from the configuration process, allowing extrapolation of the results for other possible beam patterns. In one particular embodiment, the 15° beam of mode 3 shown in FIG. 7 is used, in one particular embodiment the "p0" variant being employed.

As an alternative to performing the above steps for a single selected transmission beam pattern, the process may actually be repeated for multiple candidate transmission beam patterns (for example all available transmission beam modes), which can then avoid the need for later extrapolation steps to be taken.

The feeder terminals 205, 210 are in one embodiment also arranged to perform a similar sweep through various azimuth directions of their antenna assemblies, again typically using a predetermined beam pattern, which in one embodiment is chosen to be a narrow beam pattern such as one of the mode 3 beam patterns discussed earlier with reference to FIG. 7. However, the feeder terminals are arranged to sweep through the various azimuth directions at a faster rate than the feeder base station, such that for each selected azimuth direction of the feeder base station 200, the feeder terminals 205, 210 can sweep through an entire sequence of different azimuth directions of their antenna assemblies, in order to seek to identify the FT azimuth direction that allows the best quality link to be obtained. The feeder terminal then attempts to initiate communication back to the feeder base station 200 at that preferred FT azimuth direction that has produced the best quality link for the downlink communication from the feeder base station to the feeder terminal. As with the reception beam employed at the feeder terminal, in one embodiment the feeder terminal adopts a narrow transmission beam for this purpose.

The feeder base station 200 then monitors the communications via its reception beam and, based on communications established with the feeder terminals, determines a link quality metric for each FT. Typically, the feeder base station 200 will adopt a fixed reception beam pattern for the entirety of the configuration process, which again will typically be chosen to be one having a narrow beam width beam such as one of the mode 3 beam patterns discussed earlier. Once the feeder base station has observed a communication from each of the feeder terminals 205, 210 with which it is arranged to communicate, or a timeout condition has been reached, then the feeder base station will change to a further azimuth direction for its antenna assembly, and again transmit a reference signal.

This process is repeated for each of the selected azimuth directions of the feeder base station, so as to build up link quality metrics for each feeder terminal at each of those selected azimuth directions. The resultant data, which is also referred to herein as a link quality metric/azimuth spectrum, is then used to compute a transmission beam pattern and an azimuth direction to be employed for subsequent communications from the feeder base station to the feeder terminals. If during the configuration process the above steps are repeated for multiple candidate transmission beam patterns (also referred to herein as transmission beam modes), then a link quality metric/azimuth spectrum will be obtained for each such candidate transmission beam mode, and all of the available link quality metric/azimuth spectra can be referenced when determining the transmission beam pattern and azimuth direction to be employed for subsequent communications from the feeder base station to the feeder terminals. Otherwise extrapolation techniques can be employed using the determined link quality metric/azimuth spectrum to determine link quality information for other candidate transmission beam modes.

In one embodiment the reception beam pattern for the base station can initially be set, following the above configuration operation, to be the same pattern as determined for the transmission beam. Thereafter, if desired, subsequent processes employed during use of the base station may cause the reception beam pattern to be varied relative to the transmission beam pattern.

Figure 10:
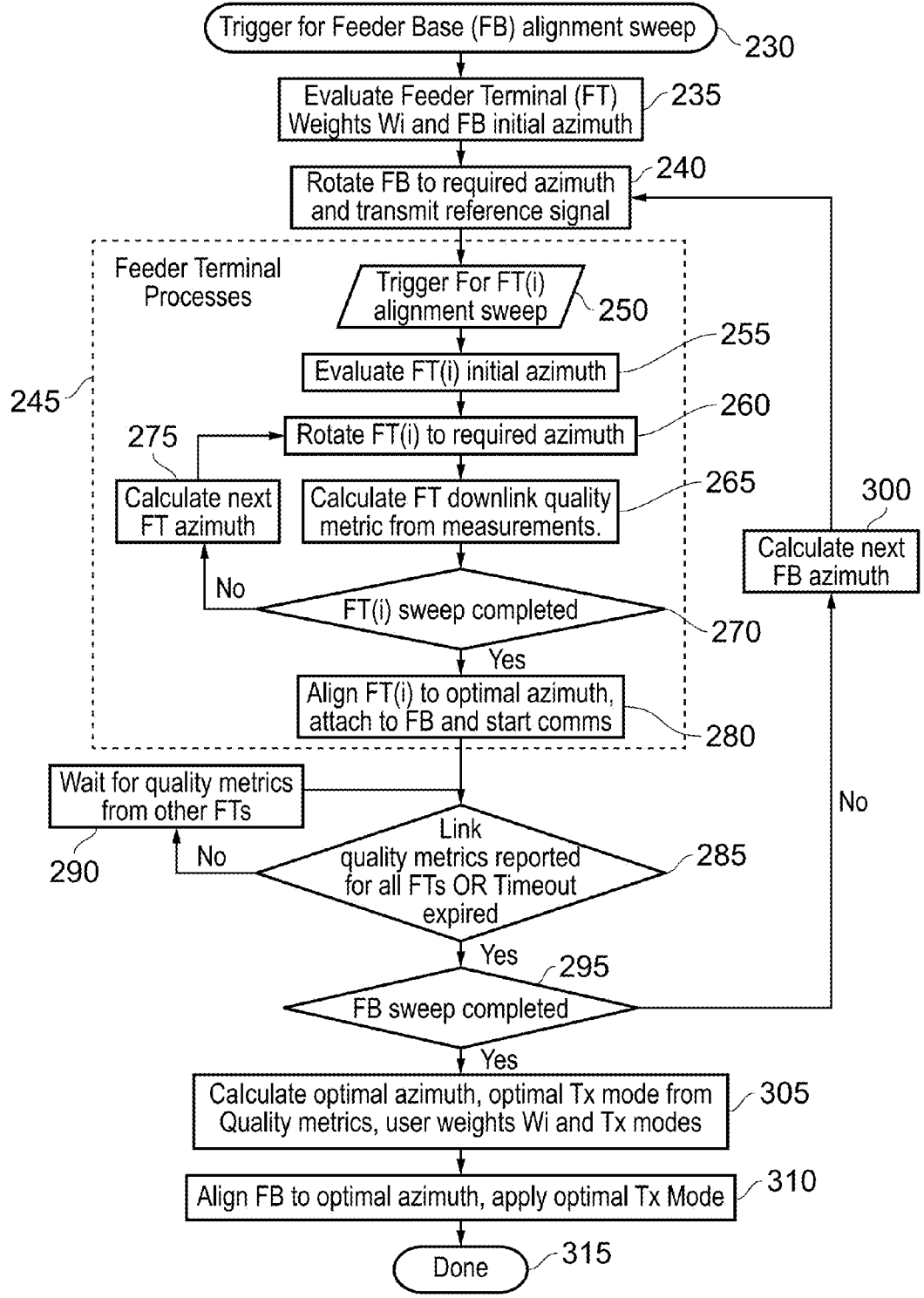
FIG. 10 is a flow diagram illustrating a configuration operation performed in accordance with one embodiment in order to determine a transmission beam pattern and azimuth direction to be used by a feeder base station.

FIG. 10 illustrates in more detail how the above described configuration process is performed in accordance with one embodiment. At step 230, it is determined whether a trigger has been received for a feeder base station alignment sweep to take place. As mentioned earlier, the trigger might take a variety of forms, but in one embodiment the trigger occurs as part of the bootstrap process performed by the feeder base station at boot time. If desired, other additional triggers may be provided. For example, the BSON may under predetermined conditions be arranged to issue such a trigger to the feeder base station in order to cause the feeder base station to enter the configuration mode of operation. Such a trigger condition for the feeder base station will also typically be co-ordinated with triggers sent to the various feeder terminals, since feeder terminals also need to undertake predetermined steps during the configuration mode of operation in order to seek to establish communications back with the feeder base station to enable link quality metrics to be determined. The operation of the feeder terminals in one embodiment will be discussed later with reference to the sequence of steps shown within the dotted box 245 in FIG. 10.

Once the trigger is detected at step 230, then the feeder base station 200 evaluates its initial azimuth direction, i.e. the direction in which the antenna assembly is currently pointing. Also at this stage, it will determine whether each of the feeder terminals is to be treated equally in the process, or whether some relative weighting information is available, indicating relative weightings to be applied to the various feeder terminals. Such weighting information may, for example, be indicative of a level of service to be provided to the various feeder terminals, with that weighting information then being taken into account during the computations performed later, as will be discussed later with reference to step 305.

At step 240, the feeder base station's antenna assembly is rotated to a required azimuth direction for the start of the configuration process, which can be an arbitrary direction, but for ease of illustration will be assumed to be the 0° direction shown in FIG. 9. As mentioned earlier, the feeder base station will adopt a default transmission beam pattern, typically a narrow transmission beam pattern, for the entirety of the configuration process. Once the required azimuth direction has been adopted, the feeder base station will then transmit a reference signal via the transmission beam pattern.

The sequence of steps within the dotted box 245 then illustrates steps performed by each of the feeder terminals 205, 210 in accordance with one embodiment. At step 250, the feeder terminals await a trigger signal for them to perform a feeder terminal alignment sweep. As mentioned earlier, this trigger will typically be co-ordinated with the trigger provided to the feeder base station, although in one embodiment the trigger to the feeder terminals can be deferred until such time as the feeder base station has taken any steps necessary to move to its required initial azimuth direction, and accordingly is ready to transmit a reference signal. The various triggers can be co-ordinated centrally in one embodiment, for example via the earlier mentioned B SON.

Once the trigger has been detected at step 250, each feeder terminal will evaluate its initial azimuth direction at step 255, and then will rotate the feeder terminal's antenna assembly to a required azimuth direction at step 260. This will typically be a predetermined starting azimuth direction during the first pass through step 260.

Then, at step 265, each feeder terminal will monitor via its reception beam to seek to detect the reference signal transmitted by the feeder base station, and on the basis of that received reference signal will measure one or more predetermined characteristics of the received signal, for example measuring the CINR, in order to determine a downlink quality metric, which in one embodiment is a throughput indication such as spectral efficiency. Once step 265 has been performed, or it has been determined that the reference signal is not being received at the current azimuth direction (in which event a default downlink quality metric will typically be determined, effectively indicating a zero link quality), then it is determined at step 270 whether the feeder terminal sweep process has been completed, i.e. whether all of the FT azimuth directions to be tested for the feeder terminal have been tested. If not, then at step 275 the next feeder terminal azimuth direction is calculated, and then at step 260 the feeder terminal's antenna assembly is rotated to that required azimuth.

In one embodiment, the feeder terminal can be arranged to step through a sequence of azimuth directions spaced regularly apart by a predetermined angle. Alternatively, the feeder terminal could in one embodiment start with relatively large changes between each azimuth direction tested, and then perform some fine tuning targeting a particular region of azimuth that appears to provide the best quality link, by adopting a series of more closely spaced azimuths for a subsequent part of the feeder terminal sweep.

After each new azimuth angle to be tested is selected, steps 260, 265, 270 and 275 are then repeated, this process continuing until it is determined at step 270 that all FT azimuth directions to be tested within the FT sweep have been completed. At that point, based on the calculated FT downlink quality metrics, the feeder terminal will determine an optimal feeder terminal azimuth direction, and at step 280 will align the feeder terminal's antenna assembly to that optimal azimuth, at which point the feeder terminal will seek to attach to the feeder base station 200 and start communication with the feeder base station. This will involve the feeder terminal transmitting a signal back to the feeder base station for reception by the feeder base station via its reception beam. The communication performed at this point can take a variety of forms, but will at least aim to serve to identify to the feeder base station 200 that that feeder terminal has observed the reference signal transmitted by the feeder base station. In the embodiment shown in FIG. 10, the communication also includes an indication of the FT downlink quality metric determined for the optimal azimuth direction adopted by the feeder terminal at step 280.

The process then proceeds to step 285, with steps 285 onwards being performed within the feeder base station 200. At step 285, the feeder base station 200 determines whether the downlink quality metrics have been reported for all of the feeder terminals, or whether a timeout condition has been met. In the event of a timeout condition being reached before downlink quality metrics have been reported for all FTs, this indicates that there are one or more FTs that have been unable to establish communication with the feeder base station based on the currently selected feeder base station azimuth direction. Accordingly, at that point a default downlink quality metric can be determined by the feeder base station, effectively identifying a zero quality in the link. If at step 285 it is determined that the downlink quality metrics have not yet been reported for all of the feeder terminals, but the timeout condition has not yet expired, then the process proceeds to step 290, where it awaits the quality metrics from other feeder terminals, for example by waiting for a predetermined time, before returning to step 285 to re-evaluate whether all downlink quality metrics have been reported.

Once it is determined at step 285 that all downlink quality metrics have been reported for the various FTs, or the timeout condition has been met, then the process proceeds to step 295 where is it determined whether the feeder base station sweep process has been completed, i.e. whether all of the azimuth directions of the feeder base station that are to be tested have indeed been tested. If not, then at step 300 the next feeder base station azimuth direction is calculated, and the process returns to step 240 in order to rotate the feeder base station to that new calculated azimuth, whereafter the reference signal is again transmitted, and the above described process is repeated.

Figure 11:
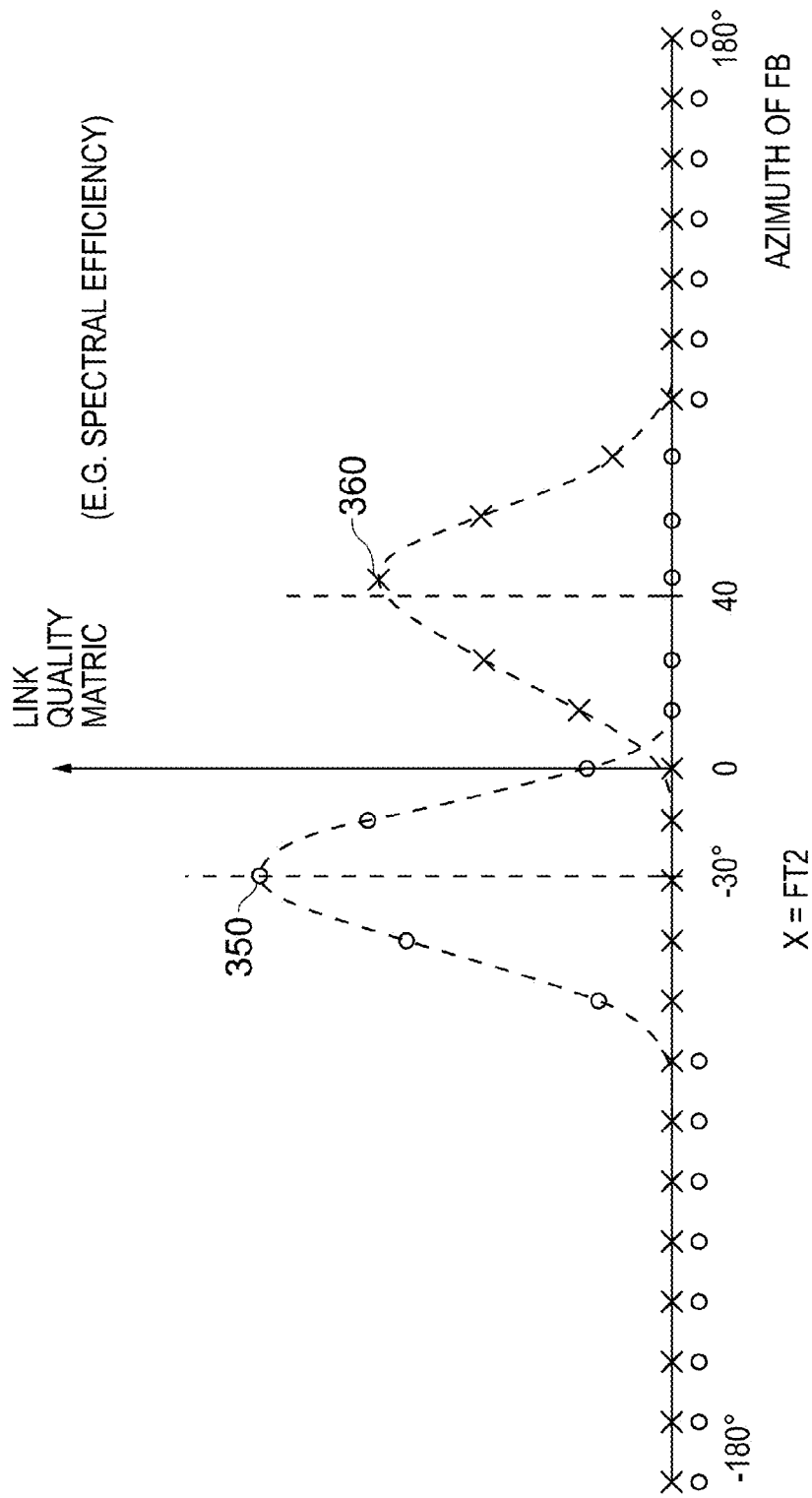
FIG. 11 schematically illustrates a link quality metric/azimuth spectrum that may be determined during performance of the process of FIG. 10.

Once at step 295 it is determined that the feeder base station sweep process has been completed, then the link quality information will have been obtained for multiple different azimuth directions, and effectively provides a link quality metric/azimuth spectrum, such as illustrated schematically in FIG. 11. In FIG. 11, it is assumed that the deployment is as shown in FIG. 9, and accordingly there are only two feeder terminals 205, 210 for which link quality metric information has been obtained. However, more generally there will typically be more than two feeder terminals connected to the feeder base station, and accordingly more than two link quality metric plots within the spectrum. As shown in FIG. 11, discrete link quality metric values will have been determined at particular azimuth directions. In this example, it is assumed that the feeder base station changes the azimuth in increments of 15° during the sweep process, and accordingly a value is determined for each 15° increment. As shown by the dotted lines, it is possible then to interpolate between the actual measured values in order to effectively produce a plot of link quality metric against the whole range of azimuth directions, to any desired resolution.

As will be apparent from FIG. 11, it will often be the case that the azimuth direction that produces the best link quality for one feeder terminal (as for example illustrated by the point 350 in association with FT1 205 or the point 360 in association with the FT2 210) will actually be an azimuth direction that produces a very poor quality link with one or more other feeder terminals. Accordingly, a balance needs to be achieved when trying to adopt an azimuth direction for subsequent communications, that allows a reasonable level of link quality to be provided for all of the various feeder terminals. Additionally, the feeder base station has at its disposal a number of different transmission beam patterns, which will typically vary between some relatively narrow beam patterns and some relatively broad beam patterns. This provides some additional flexibility and in particular in the process described in FIG. 10 a computation is performed to seek to determine an optimal combination of azimuth direction and transmission beam pattern that achieves acceptable link quality for all of the various feeder terminals.

Whilst in one embodiment a single (typically narrow) transmission beam pattern is used during the above described steps, in another embodiment the above described process of FIG. 10 (and in particular steps 240 to 300) can be repeated for multiple different candidate transmission beam patterns, resulting in a link quality metric/azimuth spectrum being determined for each tested transmission beam pattern.

As shown by step 305, once the link quality metric/azimuth spectrum has been determined (or the multiple link quality metric/azimuth spectra have been determined if multiple different transmission beam patterns are tested), then that information is provided as an input to a computation performed in order to calculate the optimal azimuth and optimal transmission beam pattern to be used for subsequent communication. As indicated in step 305, in addition to the link quality metric/azimuth spectrum, that computation also has access to the available transmission beam patterns, and to any user weight information provided at step 235 indicating any relative weighting between feeder terminals. In step 305, the transmission beam patterns are referred to as transmission modes. This is because in one embodiment not all of the available beam patterns are available for the transmission beam. In particular, whilst a wide variety of different beams can be used for reception beams without having any adverse consequences on other components in the system, it is beneficial to use a relatively small set of benign beam patterns for transmission, so that the general impact of the selection of those various transmission beams on other components within the wireless backhaul network can be well understood. In one particular embodiment, four different transmission beam patterns are available, namely the mode 1 pattern, the mode 2 p0 pattern, the mode 3 p0 and the mode 6 pattern shown in FIG. 7.

Figure 12:
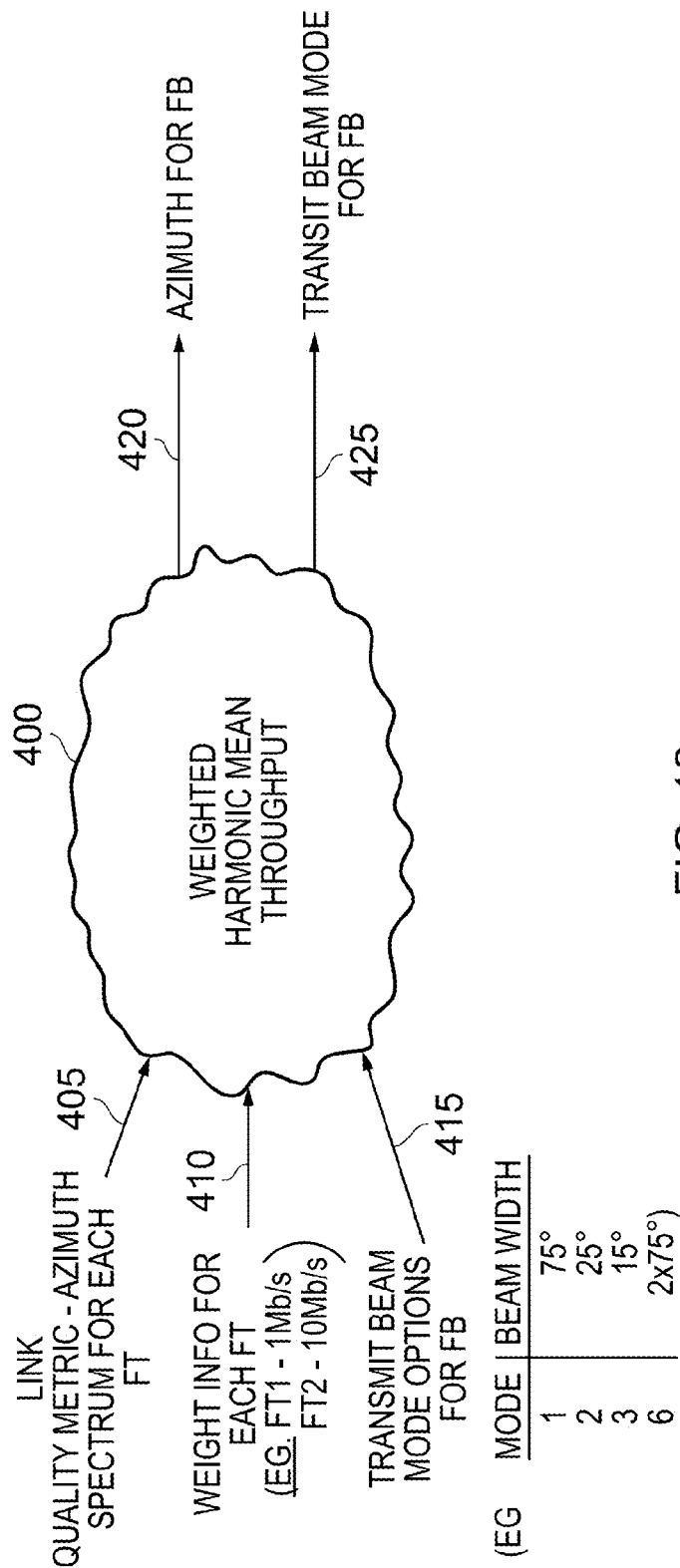
FIG. 12 schematically illustrates the computation performed in step 305 of FIG. 10 in accordance with one embodiment.

The process performed at step 305 in accordance with one embodiment is illustrated further in FIG. 12. In particular, the computation performed is a weighted harmonic mean throughput computation 400, which receives over input path 405 the link quality metric/azimuth spectrum for each feeder terminal (or multiple link quality metric/azimuth spectra if multiple transmission beam patterns are tested), and also receives over path 410 any weighting information for the various feeder terminals. In this example, it is assumed that FT2 210 has been allocated a target throughput ten times higher than FT1 205. The weighted harmonic mean throughput computation also receives over path 415 the various transmit beam mode options, which as discussed earlier in one particular embodiment include modes 1, 2, 3 and 6. FIG. 12 illustrates the various beam widths associated with those different modes. Based on these inputs, a weighted harmonic mean throughput computation is performed which will be discussed in more detail later with reference to the flow diagram of FIG. 13, but results in the generation of two output pieces of information, namely an azimuth direction for the feeder base station output over path 420 and a transmit beam mode for the feeder base station output over path 425. The transmit beam mode will be in this embodiment one of the four possible modes illustrated in FIG. 12.

Returning to FIG. 10, then following this computation at step 305 the antenna assembly controller aligns the feeder base station antenna assembly to the computed azimuth at step 310, and the antenna assembly is also controlled so as to apply the determined transmit beam mode output over path 425. Thereafter, the process ends at step 315. As mentioned earlier, in one embodiment the reception beam pattern for the base station can initially be set, following the above-described configuration operation, to be the same pattern as determined for the transmission beam. Thereafter, if desired, subsequent processes employed during use of the base station may cause the reception beam pattern to be varied relative to the transmission beam pattern.

In one embodiment, it is possible, when the FTs are listening for the reference signal from the FB during the configuration mode, that they may potentially observe a reference signal from a different FB within the wireless backhaul network, and hence attempt communication with that FB. However, in one embodiment such an event could be notified to the BSON, whereafter the BSON could instruct the relevant FT to ignore that other FB.

Figure 13:
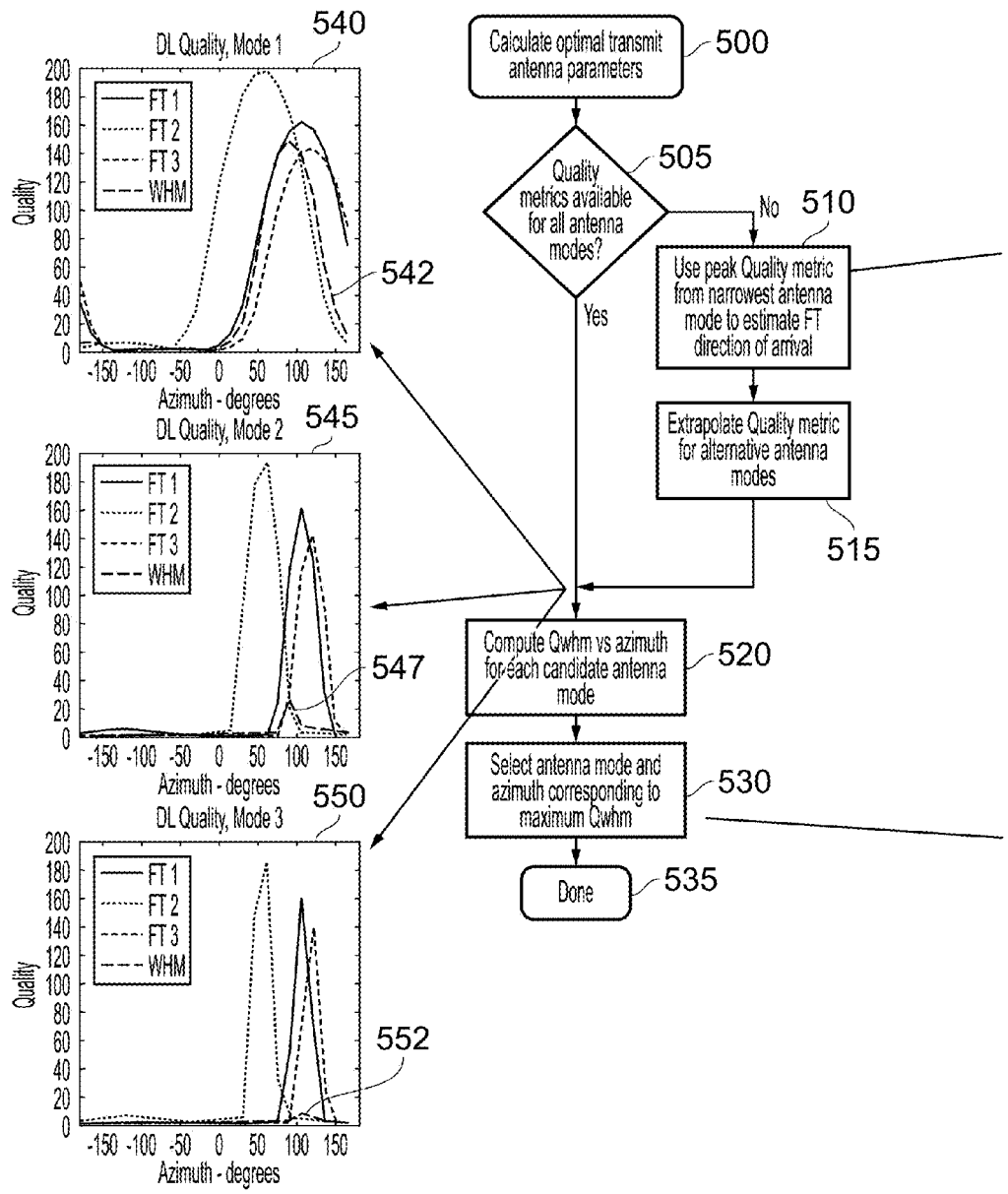
FIG. 13 is a flow diagram illustrating in more detail the weighted harmonic mean throughput computation in accordance with one embodiment.
Figure 13:
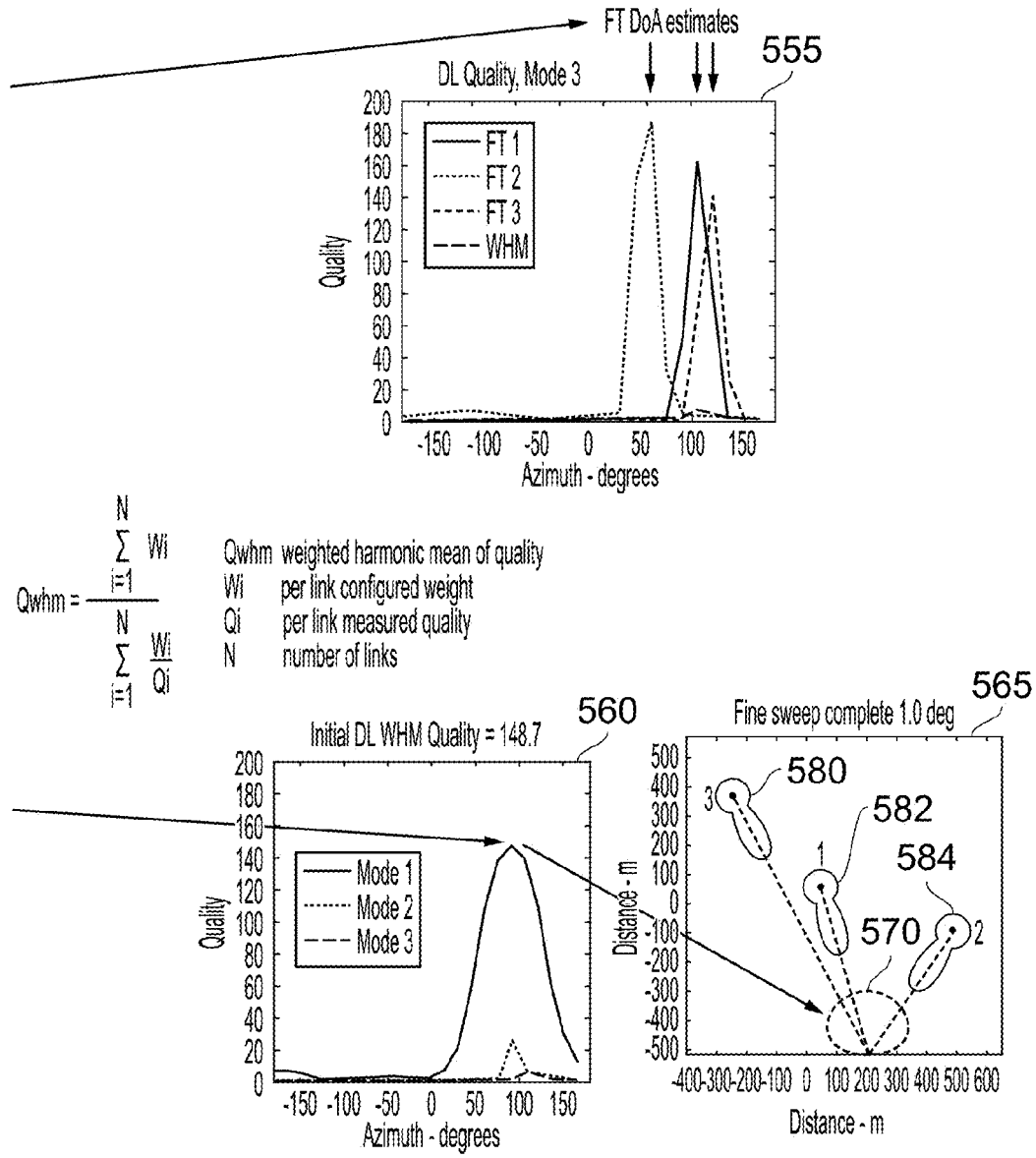

FIG. 13 is a flow diagram illustrating in more detail the performance of the weighted harmonic mean throughput computation in accordance with one embodiment. At step 500, it is determined that the process is ready to calculate the optimal transmit antenna parameters, this being the case when step 305 of FIG. 10 is reached.

At step 505, it is determined whether a link quality metric/azimuth spectrum is available for all possible antenna transmission modes that are available for selection. As mentioned earlier, this may be the case if the above described process has been repeated separately for each of the possible antenna transmission modes. However, in one embodiment the process is performed for only for a single transmission mode, typically a transmission mode providing a narrow transmission beam, and accordingly at step 505 the "no" path will be followed to step 510. It should be noted that the "no" path would also be followed if link quality metric/azimuth spectra had been obtained for more than one antenna transmission mode, but not for all possible antenna transmission modes.

Graph 555 schematically illustrates the link quality metric/azimuth spectrum that has been obtained for the narrowest antenna transmission mode amongst those tested. In this example it is assumed that transmission mode 3 is the narrowest antenna transmission mode that has been tested, indeed in one embodiment it being the only transmission mode that is tested. At step 510, the peak quality metric for each feeder terminal obtained from the link quality metric/azimuth spectrum for the narrowest antenna transmission mode tested is used to estimate the feeder terminal direction of arrival of the transmission beam transmitted from the base station, as shown schematically in the graph 555.

The process then proceeds to step 515 where the quality metric is extrapolated for all other candidate antenna transmission modes that have not been tested. At this point, a link quality metric/azimuth spectrum is obtained for each candidate antenna transmission mode, as shown schematically by the graphs 540, 545, 550. In this particular example, it is assumed that the possible candidate antenna transmission modes are mode 1, mode 2 and mode 3. It will be appreciated that if it was determined at step 505 that quality metrics were available for all of the candidate antenna transmission modes, then the graphs 540, 555, 560 will be available without needing to perform steps 510 and 515.

The process then proceeds to step 520, where a weighted harmonic mean operation is performed using the equation shown to the right-hand side of step 520 in FIG. 13. In particular, the weighted harmonic mean of quality (Qwhm) is determined for each candidate antenna transmission mode using the link quality metric/azimuth spectrum for that candidate antenna transmission mode, and any provided weighting information for the various feeder terminals.

This result in the generation of a Qwhm plot for each candidate antenna transmission mode (shown by the plots 542, 547, 552 in the graphs 540, 555, 560), and then at step 530 the combination of antenna mode and azimuth direction is selected that corresponds to the maximum Qwhm value. This is indicated schematically by the graph 560 which shows the three separate plots, where in this example the maximum Qwhm value corresponds to the antenna transmission mode and azimuth illustrated schematically in the diagram 565 by the reference numeral 570 (i.e. transmission mode 1). The patterns 580, 582, 504 represent the reception beam patterns used by the various feeder terminals.

If desired, once the antenna transmission mode and azimuth have been selected using the above process, a fine tuning process can be employed in order to fine tune the azimuth direction without making any change to the antenna transmission mode. During this process, a sweep can be made within a fairly small range of angles, for example 15 degrees either side of the selected azimuth, but with the sweep performed in small increments, for example at 1 degree intervals. For each azimuth, downlink quality information for each of the feeder terminals can be obtained. As a result, a link quality metric/azimuth spectrum is thereby obtained for the selected small range of angles, and for the particular selected antenna transmission mode. Step 520 of FIG. 13 can then effectively be repeated, but only for the selected antenna transmission mode and only across the selected small range of angles. Thereafter, in an equivalent to step 530, an azimuth can be selected corresponding to the maximum Qwhm value (but with the antenna transmission mode remaining fixed), whereafter the azimuth is adjusted to that newly selected azimuth value.

As mentioned earlier, the above described configuration process can be performed in a wide variety of different deployments, and is not restricted to the particular design of feeder base station described earlier. However, by way of illustration, it provides a particularly efficient mechanism for controlling the earlier described feeder base station. In particular, as discussed for example with reference to FIG. 5, in accordance with that embodiment beamforming is performed at the RF stage (i.e. at the radio stage), rather than at the baseband stage (i.e. at the digital signal processing stage) which would be the stage to the right of the components shown in FIG. 5. The above described operation may be implemented by the antenna controller 114 of FIG. 6 in order to produce suitable antenna direction control signals for the antenna motor control circuitry 120 in order to drive the antenna arrays 110 to each of the selected azimuth directions to be tested during the configuration process. Based on the obtained measurements during that process, such as the CINR reports forwarded from the MAC layer 124 to the antenna controller 114, the antenna controller can then determine the relevant link quality metrics in order to build up the link quality metrics/azimuth spectrum during the course of the configuration process. The antenna controller 114 can then also implement the transmission beam determination circuitry function by determining a suitable transmission beam pattern and azimuth direction to use for subsequent communications. Hence, at the end of the configuration mode, the antenna controller 114 can then output the desired azimuth direction information to the antenna motor control circuitry 120 and can issue a transmit mode signal to the front end control circuitry 116 indicative of the transmission beam to use for subsequent communication. The front end control circuitry 116 can then cause the elements 118 to employ the required transmit beam pattern through appropriate switch, attenuation and phase shift control.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

The invention claimed is:

1. Antenna apparatus for operating as a base station in a wireless network, comprising:
   a rotatable antenna assembly configured to employ a transmission beam pattern selected from a plurality of transmission beam patterns;
   a controller to rotate the rotatable antenna assembly in order to alter an azimuth direction of the rotatable antenna assembly;
   the controller being configured, during a configuration mode, to perform a sweep operation in order to rotate the rotatable antenna assembly to each of multiple selected azimuth directions;
   quality metric determination circuitry to determine, for each selected azimuth direction, a link quality metric for each of a plurality of wireless terminals based on communication between the plurality of wireless terminals and the base station whilst the rotatable antenna assembly is at that selected azimuth direction; and
   transmission beam determination circuitry to determine, from the link quality metrics determined for the plurality of wireless terminals at each selected azimuth direction, both an output transmission beam pattern from said plurality of transmission beam patterns, and an output azimuth direction;
   for a subsequent communication with the plurality of wireless terminals, the controller being arranged to rotate the rotatable antenna assembly to said output azimuth direction and the rotatable antenna assembly being arranged to employ said output transmission beam pattern;
   wherein the transmission beam determination circuitry is configured to perform a harmonic mean operation using as inputs the link quality metrics determined for the plurality of wireless terminals at each selected azimuth direction and the plurality of transmission beam patterns, in order to determine the output azimuth direction and the output transmission beam pattern;

wherein: the link quality metrics determined for the plurality of wireless terminals at each selected azimuth direction form a link quality metric/azimuth spectrum for a predetermined transmission beam pattern; and the transmission beam determination circuitry is arranged, based on the link quality metric/azimuth spectrum for the predetermined transmission beam pattern, to perform an extrapolation operation to determine, for each of the plurality of transmission beam patterns, a corresponding link quality metric/azimuth spectrum.

2. The antenna apparatus as claimed in claim 1, wherein the transmission beam determination circuitry is arranged to receive weighting information associated with at least one wireless terminal, and is arranged to utilise the weighting information in combination with the link quality metrics when determining said output azimuth direction and said output transmission beam pattern.

3. The antenna apparatus as claimed in claim 2, wherein the weighting information is indicative of a level of service to be provided to at least one of the wireless terminals.

4. The antenna apparatus as claimed in claim 1,
wherein the transmission beam determination circuitry is arranged to receive weighting information associated with at least one wireless terminal, and is arranged to utilise the weighting information in combination with the link quality metrics when determining said output azimuth direction and said output transmission beam pattern, and
wherein the harmonic mean operation is a weighted harmonic mean operation and the transmission beam determination circuitry utilises the weighting information as a further input to the weighted harmonic mean operation.

5. The antenna apparatus as claimed in claim 1, wherein the link quality metric is a throughput indication for an associated wireless terminal.

6. The antenna apparatus as claimed in claim 1, wherein, during the configuration mode, the rotatable antenna assembly is configured to employ the predetermined transmission beam pattern.

7. The antenna apparatus as claimed in claim 1, wherein, prior to performing the extrapolation operation, the transmission beam determination circuitry uses peak quality metric information within the link quality metric/azimuth spectrum for the predetermined transmission beam pattern to determine, for each of the plurality of wireless terminals, a direction of arrival of the transmission beam from the antenna apparatus.

8. The antenna apparatus as claimed in claim 1, wherein:
the transmission beam determination circuitry is arranged during performance of the harmonic mean operation to compute a harmonic mean function for each of the plurality of transmission beam patterns using the corresponding link quality metric/azimuth spectrum in order to obtain, for each of the plurality of transmission beam patterns, an indication of how link quality varies with azimuth direction; and
the transmission beam determination circuitry then being arranged to select, as the output azimuth direction and the output transmission beam pattern, a combination of a transmission beam pattern and an azimuth direction that provides a highest link quality indication.

9. The antenna apparatus as claimed in claim 1, wherein the link quality metric relates to a downlink communication from the base station to an associated wireless terminal, the quality metric determination circuitry being configured to determine the link quality metric from information received from the associated wireless terminal whilst the rotatable antenna assembly is at the selected azimuth direction.

10. The antenna apparatus as claimed in claim 1, wherein the wireless network is a wireless backhaul network for coupling a core network to a wireless access network, and the base station is a feeder base station for connection to the core network.

11. The antenna apparatus as claimed in claim 10, wherein at least one of the wireless terminals is a feeder terminal for connection to an access point of the wireless access network.

12. The antenna apparatus as claimed in claim 1, wherein the multiple selected azimuth directions employed during the sweep operation are regularly spaced within a 360 degrees range of rotation.

13. A system comprising:
an antenna apparatus as claimed in claim 1, for operating as a base station in a wireless network; and
a plurality of wireless terminals for communication via the wireless network with the base station;
at least one of the wireless terminals having a wireless terminal rotatable antenna assembly which, during the configuration mode, is swept through multiple wireless terminal azimuth directions whilst the rotatable antenna assembly of the base station is at each selected azimuth direction, in order to detect a preferred wireless terminal azimuth direction for each selected azimuth direction, and
the quality metric determination circuitry of the base station is configured to determine, for each selected azimuth direction, the link quality metric for each of said at least one of the wireless terminals based on communication between said at least one of the wireless terminals and the base station whilst the rotatable antenna assembly is at the selected azimuth direction and said at least one of the wireless terminals is at its preferred wireless terminal azimuth direction.

14. The system as claimed in claim 13, wherein said at least one of the wireless terminals is arranged to measure a downlink quality metric at each of the multiple wireless terminal azimuth directions, and to select the preferred wireless terminal azimuth direction based on the measured downlink quality metrics.

15. The system as claimed in claim 14, wherein the quality metric determination circuitry of the base station is configured to receive from said at least one of the wireless terminals information indicative of the measured downlink quality metric at the preferred wireless terminal azimuth direction.

16. A method of configuring a transmission beam for an antenna apparatus to operate as a base station in a wireless network, the antenna apparatus having a rotatable antenna assembly to employ a transmission beam pattern selected from a plurality of transmission beam patterns, and a controller to rotate the rotatable antenna assembly in order to alter an azimuth direction of the rotatable antenna assembly, the method comprising:
performing a sweep operation in order to rotate the rotatable antenna assembly to each of multiple selected azimuth directions;
determining, for each selected azimuth direction, a link quality metric for each of a plurality of wireless terminals based on communication between the plurality of wireless terminals and the base station whilst the rotatable antenna assembly is at that selected azimuth direction;

determining, from the link quality metrics determined for the plurality of wireless terminals at each selected azimuth direction, both an output transmission beam pattern from said plurality of transmission beam patterns, and an output azimuth direction; and for a subsequent communication with the plurality of wireless terminals, rotating the rotatable antenna assembly to said output azimuth direction and causing the rotatable antenna assembly to employ said output transmission beam pattern, wherein, during the determining step, a harmonic mean operation is performed using as inputs the link quality metrics determined for the plurality of wireless terminals at each selected azimuth direction and the plurality of transmission beam patterns, in order to determine the output azimuth direction and the output transmission beam pattern;

wherein: the link quality metrics determined for the plurality of wireless terminals at each selected azimuth direction form a link quality metric/azimuth spectrum for a predetermined transmission beam pattern; and the method further comprises, based on the link quality metric/azimuth spectrum for the predetermined transmission beam pattern, performing an extrapolation operation to determine, for each of the plurality of transmission beam patterns, a corresponding link quality metric/azimuth spectrum.

17. Antenna apparatus for operating as a base station in a wireless network, comprising:

rotatable antenna means for employing a transmission beam pattern selected from a plurality of transmission beam patterns;

control means for rotating the rotatable antenna means in order to alter an azimuth direction of the rotatable antenna means;

the control means for performing a sweep operation during a configuration mode in order to rotate the rotatable antenna means to each of multiple selected azimuth directions;

quality metric determination means for determining, for each selected azimuth direction, a link quality metric for each of a plurality of wireless terminal means based on communication between the plurality of wireless terminal means and the base station whilst the rotatable antenna means is at that selected azimuth direction; and transmission beam determination means for determining, from the link quality metrics determined for the plurality of wireless terminal means at each selected azimuth direction, both an output transmission beam pattern from said plurality of transmission beam patterns, and an output azimuth direction;

for a subsequent communication with the plurality of wireless terminal means, the control means rotating the rotatable antenna means to said output azimuth direction and the rotatable antenna means employing said output transmission beam pattern;

wherein the transmission beam determination means is configured to perform a harmonic mean operation using as inputs the link quality metrics determined for the plurality of wireless terminal means at each selected azimuth direction and the plurality of transmission beam patterns, in order to determine the output azimuth direction and the output transmission beam pattern;

wherein: the link quality metrics determined for the plurality of wireless terminals at each selected azimuth direction form a link quality metric/azimuth spectrum for a predetermined transmission beam pattern; and the transmission beam determination means is arranged, based on the link quality metric/azimuth spectrum for the predetermined transmission beam patter, to perform an extrapolation operation to determine, for each of the plurality of transmission beam patterns, a corresponding link quality metric/azimuth spectrum.

\* \* \* \* \*